United States Patent
Kean

(10) Patent No.: US 12,191,827 B2
(45) Date of Patent: Jan. 7, 2025

(54) SYSTEM, METHOD, AND OUTPHASING POWER AMPLIFIER HAVING VECTOR GENERATOR AND IQ MODULATORS

(71) Applicant: Rockwell Collins, Inc., Cedar Rapids, IA (US)

(72) Inventor: Timothy L. Kean, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 479 days.

(21) Appl. No.: 17/576,291

(22) Filed: Jan. 14, 2022

(65) Prior Publication Data

US 2023/0231524 A1    Jul. 20, 2023

(51) Int. Cl.
   *H03F 3/24* (2006.01)

(52) U.S. Cl.
   CPC ....... *H03F 3/245* (2013.01); *H03F 2200/336* (2013.01); *H03F 2200/451* (2013.01)

(58) Field of Classification Search
   USPC ....................................................... 330/291
   See application file for complete search history.

(56) References Cited

U.S. PATENT DOCUMENTS

| | | |
|---|---|---|
| 6,369,651 B2 | 4/2002 | Dent |
| 7,570,711 B1 | 8/2009 | Chavez et al. |
| 8,233,563 B2 | 7/2012 | Wurm et al. |
| 8,824,978 B2 * | 9/2014 | Briffa ............... H03F 3/195 455/127.1 |
| 8,963,636 B1 | 2/2015 | Krett et al. |
| 9,020,453 B2 * | 4/2015 | Briffa ............... H04B 1/0483 455/127.1 |
| 9,106,500 B2 | 8/2015 | Sorrells et al. |
| 9,912,303 B2 | 3/2018 | Barton et al. |
| 10,116,383 B2 | 10/2018 | Wesson et al. |
| 2004/0101065 A1 | 5/2004 | Hagh et al. |
| 2020/0212848 A1 | 7/2020 | Lemberg et al. |

FOREIGN PATENT DOCUMENTS

GB    2463443 B    9/2012

OTHER PUBLICATIONS

Yahalom, Gilad (2012). Amplitude and Phase Modulation Techniques for an Asymmetric Multi-Level Outphasing Transmitter [Unpublished Master's thesis]. Massachusetts Institute of Technology.

* cited by examiner

*Primary Examiner* — Andrea Lindgren Baltzell
*Assistant Examiner* — Jose E Pinero
(74) *Attorney, Agent, or Firm* — Suiter Swantz IP

(57) ABSTRACT

A system may include a first IQ modulator configured to: based on an I and a Q, produce a zero to ninety degree variable phase shifted output signal that changes relative to an input envelope of an RF drive waveform of the RF drive. The system may include a first amplifier path configured to: output a first phase modulated signal. The system may include a second IQ modulator configured to: based on the I and the −Q, produce a zero to negative ninety degree variable phase shifted output signal that changes relative to the input envelope. The system may include a second amplifier path configured to: output a second phase modulated signal, wherein the second phase modulated signal is complementary to the first phase modulated signal. The system may include a vector generator configured to: generate the Q and the −Q for the first and second IQ modulators, respectively.

20 Claims, 24 Drawing Sheets

SYSTEM, METHOD, AND OUTPHASING POWER AMPLIFIER HAVING VECTOR GENERATOR AND IQ MODULATORS

BACKGROUND

There are many ways to create phase-complementary drive signals for a high-efficiency outphasing power amplifier, but most are very complex and/or narrow-band in operation. A simpler method is needed that reduces complexity, hardware cost, and enables standalone operation of the amplifier without the need to re-design the complete radio frequency (RF) path from baseband to antenna.

SUMMARY

In one aspect, embodiments of the inventive concepts disclosed herein are directed to a system. The system may include an input amplifier configured to: receive a radio frequency (RF) drive from an exciter; amplify the RF drive; and output an amplified RF drive, wherein the RF drive includes phase and envelope information of a modulated signal. The system may include an input limiter configured to: receive the amplified RF drive; cap the amplified RF drive to no more than a predetermined voltage; and output a capped amplified RF drive. The system may include first in-phase component signal (I) and quadrature component signal (Q) modulator (IQ modulator) configured to: receive the capped amplified RF drive; receive an I and a Q; based at least on the I and the Q, produce a zero degree to ninety degree variable phase shifted output signal that changes relative to an input envelope of an RF drive waveform of the RF drive; and output the zero degree to ninety degree variable phase shifted output signal. The system may include a first amplifier path configured to: receive the zero degree to ninety degree variable phase shifted output signal; and output a first phase modulated signal. The system may include a second IQ modulator configured to: receive the capped amplified RF drive; receive the I and a negative Q (−Q); based at least on the I and the −Q, produce a zero degree to negative ninety degree variable phase shifted output signal that changes relative to the input envelope of the RF drive waveform of the RF drive; and output the zero degree to negative ninety degree variable phase shifted output signal. The system may include a second amplifier path configured to: receive the zero degree to negative ninety degree variable phase shifted output signal; and output a second phase modulated signal, wherein the second phase modulated signal is complementary to the first phase modulated signal. The system may include a vector generator configured to: generate at least the Q and the −Q; output the Q to the first IQ modulator; and output the −Q to the second IQ modulator.

In a further aspect, embodiments of the inventive concepts disclosed herein are directed to a method. The method may include: receiving, by an input amplifier, a radio frequency (RF) drive from an exciter; amplifying, by the input amplifier, the RF drive; outputting, by the input amplifier, an amplified RF drive, wherein the RF drive includes phase and envelope information of a modulated signal; receiving, by an input limiter, the amplified RF drive; capping, by the input limiter, the amplified RF drive to no more than a predetermined voltage; outputting, by the input limiter, a capped amplified RF drive; receiving, by a first in-phase component signal (I) and quadrature component signal (Q) modulator (IQ modulator), the capped amplified RF drive; receiving, by the first IQ modulator, an I and a Q; based at least on the I and the Q, producing, by the first IQ modulator, a zero degree to ninety degree variable phase shifted output signal that changes relative to an input envelope of an RF drive waveform of the RF drive; outputting, by the first IQ modulator, the zero degree to ninety degree variable phase shifted output signal; receiving, by a first amplifier path, the zero degree to ninety degree variable phase shifted output signal; outputting, by the first amplifier path, a first phase modulated signal; receiving, by a second IQ modulator, the capped amplified RF drive; receiving, by the second IQ modulator, the I and a negative Q (−Q); based at least on the I and the −Q, producing, by the second IQ modulator, a zero degree to negative ninety degree variable phase shifted output signal that changes relative to the input envelope of the RF drive waveform of the RF drive; outputting, by the second IQ modulator, the zero degree to negative ninety degree variable phase shifted output signal; receiving, by a second amplifier path, the zero degree to negative ninety degree variable phase shifted output signal; outputting, by the second amplifier path, a second phase modulated signal, wherein the second phase modulated signal is complementary to the first phase modulated signal; generating, by a vector generator, at least the Q and the −Q; outputting, by the vector generator, the Q to the first IQ modulator; and outputting, by the vector generator, the −Q to the second IQ modulator.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1A:
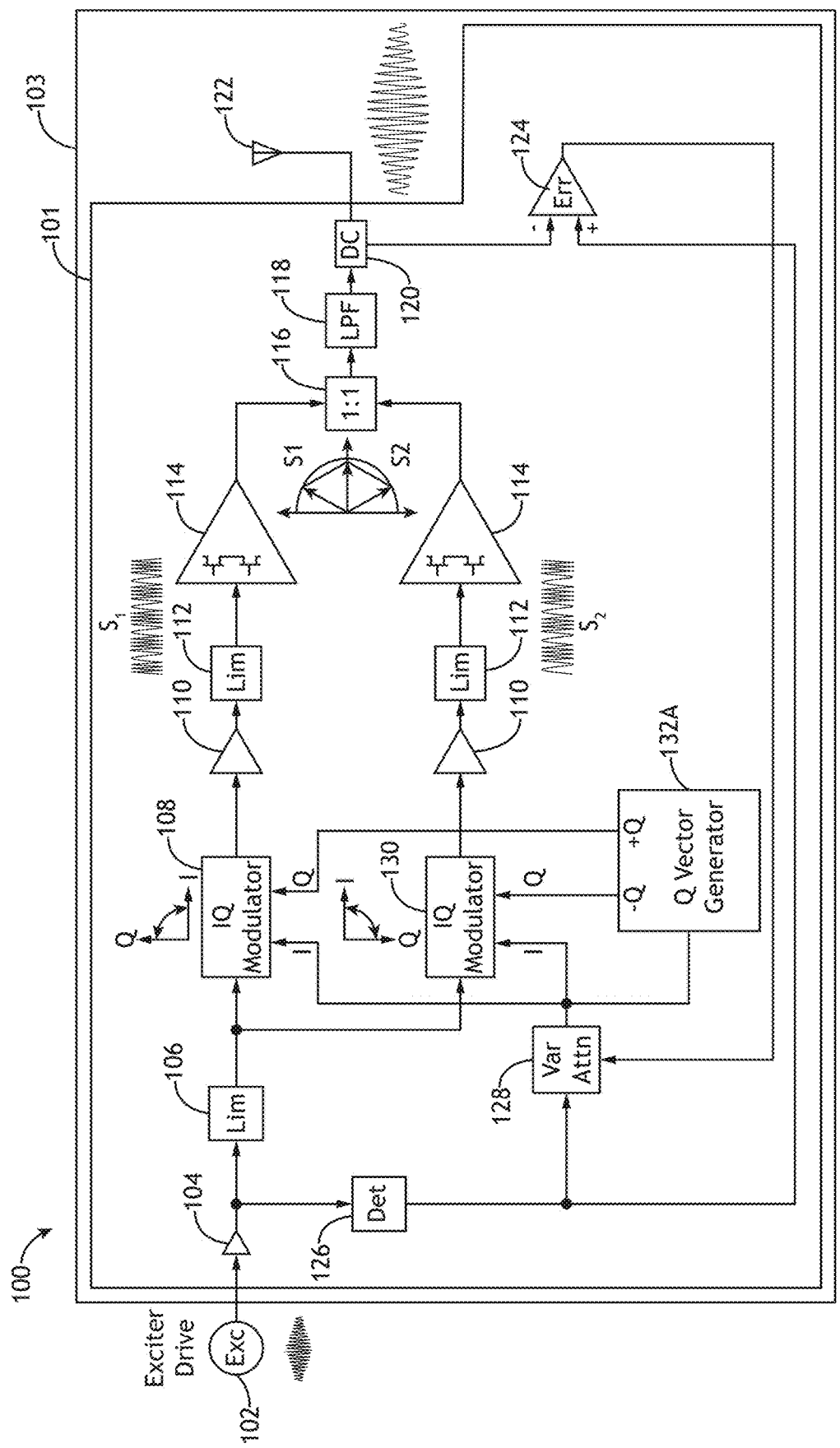
FIGS. 1A, 1B, 1C, and 1D show a view of an exemplary embodiment of a system including a processor and a GPU according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein may be directed to a method and a system including a power amplifier (e.g., outphasing power amplifier (e.g., full-bridge outphasing power amplifier)), wherein the power amplifier may include a vector generator (e.g., a quadrature component signal (Q) vector generator or an in-phase component signal (I) and Q vector generator) and in-phase component signal (I) and quadrature component signal (Q) modulators (IQ modulators).

Some embodiments may provide a simple, yet highly accurate means of generating the phase complementary RF signals needed for driving amplifiers, that may make up a full-bridge outphasing power amplifier. Through the use of conventional IQ modulators and simple mathematical equation(s), some embodiments may create phase complementary RF signals using varied levels of complexity, while enabling high linearity amplification of any signal type.

The benefits of Class-D amplifiers are well known, including the potential for 100% drain efficiency, lower power consumption, and reduced amplifier weight, complexity, and operating cost. The challenge is making Class-D amplifiers linear so they can amplify both simple waveforms like amplitude modulation (AM), and complex waveforms, such as high peak-to-average-ratio (PAR) digital waveforms as well. On the other hand, Class-AB amplifiers normally used for linear amplification need to be heavily biased to amplify high-PAR wideband (WB) waveforms, resulting in low efficiency at low average power. If operated 6 decibels (dB) below peak output, Class-AB amplifiers' efficiency are reduced to ⅓ of their peak efficiency. Class-D amplifiers are highly non-linear and typically always operate in a saturated mode but can be linearized. The most common method for linearization is high-level modulation of the supply voltage, which suffers from bandwidth limitations and low efficiency at reduced power. Some embodiments may use outphasing power amplifiers (PA), which are simple to create, have all the advantages of high-efficiency, but do not require additional power-robbing circuitry to linearize.

Conventional outphasing transmitters, which include conventional outphasing power amplifiers, currently require baseband I and Q input signals from a modulator-demodulator (MODEM). Additionally, conventional outphasing transmitters currently do not work with existing exciters. Currently, conventional outphasing transmitters require a design as a complete transmitter. Some embodiments include an RF-driven outphasing power amplifier, which may have a reduced cost, lower complexity, lower power consumption, and standalone amplifier installations.

Referring generally now to FIGS. 1A-3C, an exemplary embodiment of a system 100 according to the inventive concepts disclosed herein is depicted. In some embodiments, the system 100 may include an exciter 102 and a transmitter 103, which may include at least one power amplifier 101 (e.g., at least one outphasing power amplifier (e.g., at least one full-bridge outphasing power amplifier)) and at least one antenna 122, some or all of which may be communicatively coupled at any given time. The exciter 102 may be configured to output a radio frequency (RF) drive to the power amplifier 101, wherein the RF drive includes phase and envelope information of a modulated signal. The power amplifier 101 may be configured to accept modulated RF excitation from the exciter 102. The antenna 122 may be configured to receive a forward signal from the power amplifier 101 and transmit an RF signal based on the forward signal. In some embodiments, no processor is required for creating complimentary phase-modulated signals, $S_1$ and $S_2$, but a processor may be used if desired. In some embodiments, the power amplifier 101 may be configured to amplify all signal types, including simple and/or complex waveforms. In some embodiments, IQ modulators 108, 130 may be used as phase shifters to create signals $S_1$ and $S_2$. In some embodiments, phase modulated RF may replace a conventional local oscillator (LO), which is normally used for IQ modulators; in some embodiments, the power amplifier 101 lacks a local oscillator (LO). In some embodiments, I and Q vectors may be adjusted to vary a phase of each of the signals $S_1$ and $S_2$ in accordance with signal amplitude, and only 90 degrees of phase shift may be needed for the complementary signals $S_1$ and $S_2$.

Referring now to FIGS. 1A, 1B, 1C, and 1D, an exemplary embodiment of the system 100 according to the inventive concepts disclosed herein is depicted. The power amplifier 101 may include at least one input amplifier 104, at least one input limiter 106, at least one first IQ modulator 108, at least one first amplifier path (e.g., including at least one first squaring amplifier 110, at least one first squaring limiter 112, and/or at least one first final output amplifier 114), at least one second IQ modulator 130, at least one second amplifier path (e.g., including at least one second squaring amplifier 110, at least one second squaring limiter 112, and/or at least one second final output amplifier 114), at least one Q vector generator 132A, at least one output balanced transformer 116, at least one low pass filter 118, at least one directional coupler 120, at least one input detector 126, at least one feedback error amplifier 124, and/or at least one variable attenuator 128, some or all of which may be communicatively coupled at any given time.

The input amplifier 104 may be configured to: receive a radio frequency (RF) drive from the exciter 102; amplify the RF drive; and/or output an amplified RF drive, wherein the RF drive includes phase and envelope information of a modulated signal.

The input limiter 106 may be configured to: receive the amplified RF drive; cap the amplified RF drive to no more than a predetermined voltage; and/or output a capped amplified RF drive.

The first IQ modulator 108 may be configured to: receive the capped amplified RF drive; receive an I and a Q; based at least on the I and the Q, produce a zero degree to ninety degree variable phase shifted output signal that changes relative to an input envelope of an RF drive waveform of the RF drive; and/or output the zero degree to ninety degree variable phase shifted output signal.

The first amplifier path may be configured to: receive the zero degree to ninety degree variable phase shifted output signal; and output a first phase modulated signal. For example, the first amplifier path may include the first squaring amplifier 110, the first squaring limiter 112, and/or the first final output amplifier 114. The first squaring amplifier 110 may be configured to: receive the zero degree to ninety degree variable phase shifted output signal; amplify the zero degree to ninety degree variable phase shifted output signal; and/or output an amplified zero degree to ninety degree variable phase shifted output signal. The first squaring limiter 112 may be configured to: receive the amplified zero degree to ninety degree variable phase shifted output signal; square the amplified zero degree to ninety degree variable phase shifted output signal to provide a first square wave drive signal; and/or output the first square wave drive signal. The first final output amplifier 114 may be configured to: receive the first square wave drive signal; amplify the first square wave drive signal to provide the first phase modulated signal; and/or output the first phase modulated signal.

The second IQ modulator 130 may be configured to: receive the capped amplified RF drive; receive the I and a negative Q (−Q); based at least on the I and the −Q, produce a zero degree to negative ninety degree variable phase shifted output signal that changes relative to the input envelope of the RF drive waveform of the RF drive; and/or output the zero degree to negative ninety degree variable phase shifted output signal.

The second amplifier path may be configured to: receive the zero degree to negative ninety degree variable phase shifted output signal; and/or output a second phase modulated signal, wherein the second phase modulated signal is complementary to the first phase modulated signal. For example, the second amplifier path may include the second squaring amplifier 110, the second squaring limiter 112, and/or the second final output amplifier 114. The second squaring amplifier 110 may be configured to: receive the zero degree to negative ninety degree variable phase shifted output signal; amplify the zero degree to negative ninety degree variable phase shifted output signal; and/or output an amplified zero degree to negative ninety degree variable phase shifted output signal. The second squaring limiter 112 may be configured to: receive the amplified zero degree to negative ninety degree variable phase shifted output signal; square the amplified zero degree to negative ninety degree variable phase shifted output signal to provide a second square wave drive signal; and/or output the second square wave drive signal. The second final output amplifier 114 may be configured to: receive the second square wave drive signal; amplify the second square wave drive signal to provide the second phase modulated signal; and/or output the second phase modulated signal.

Figure 1C:
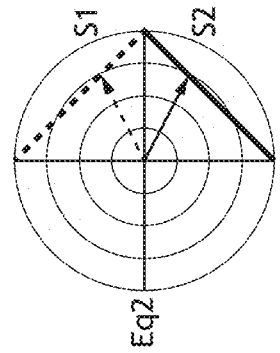
Figure 1B:
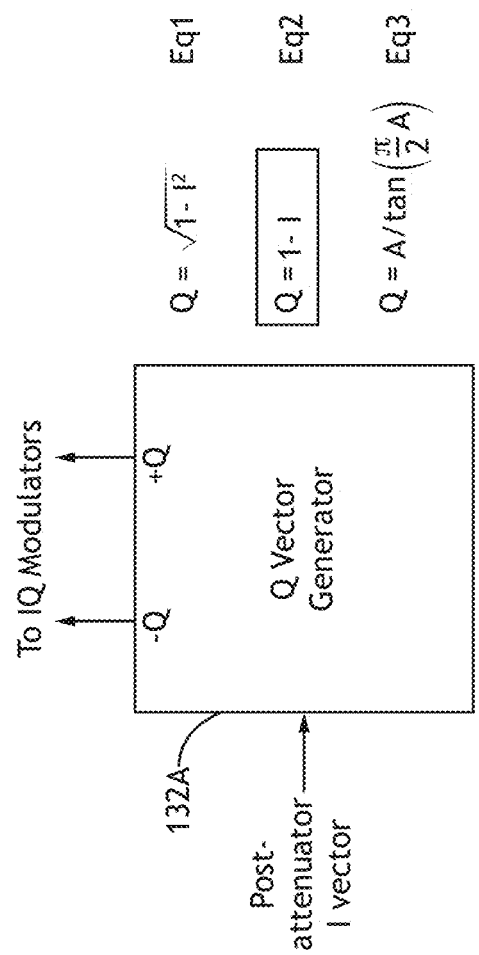
Figure 1D:
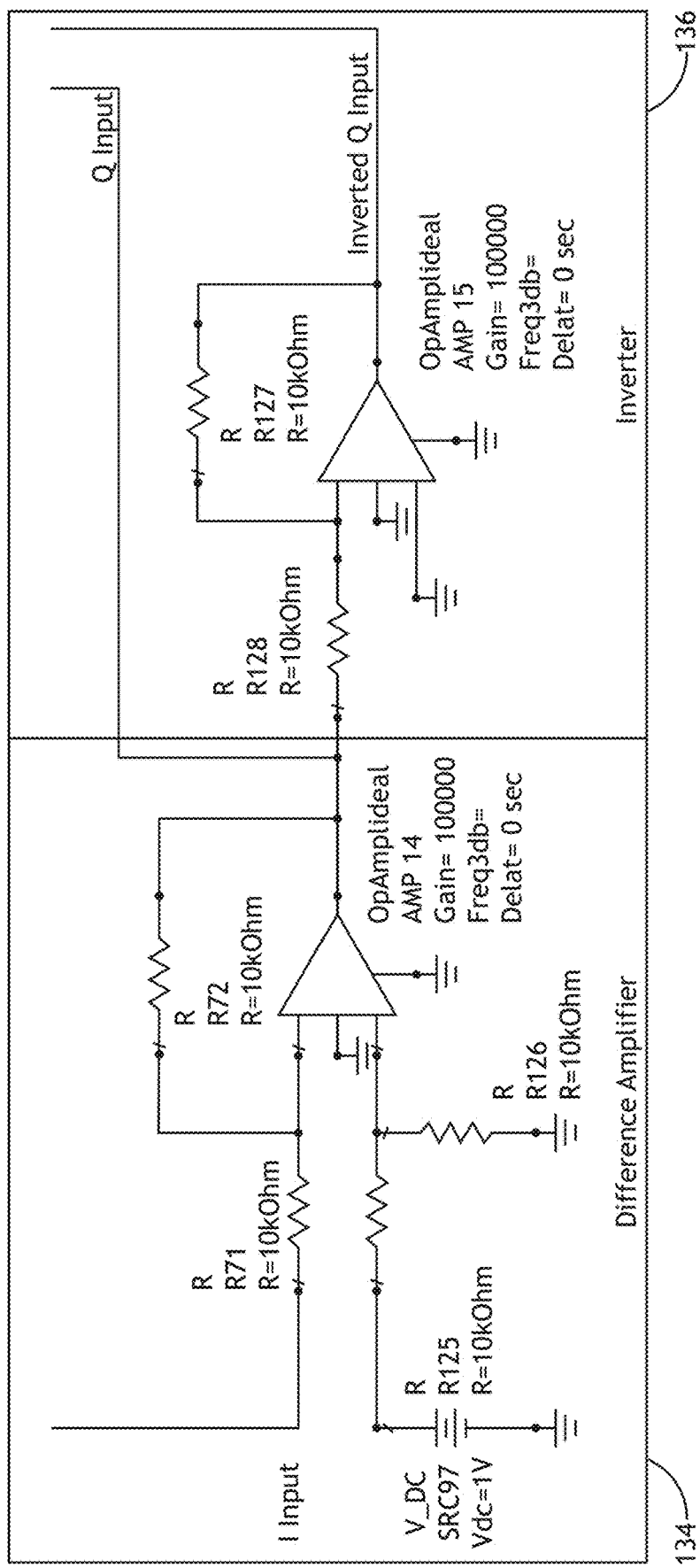

The Q vector generator 132A may be configured to: generate at least the Q and the −Q; output the Q to the first IQ modulator 108; and/or output the −Q to the second IQ modulator 130. In some embodiments, the Q vector generator 132A may be an analog Q vector generator. In some embodiments, the analog Q vector generator uses an equation of, Q equals 1 minus the I (as shown in FIGS. 1B and 1C), to generate the Q and the −Q. In some embodiments, as shown in FIG. 1D, the analog Q vector generator may include a difference amplifier 134 and an inverter amplifier 136. The difference amplifier 134 may be configured to compare the I to a reference voltage (e.g., 1 volt) to generate the Q. The inverter amplifier 136 may be configured to generate the −Q.

The output balanced transformer 116 may be configured to: receive the first phase modulated signal and the second phase modulated signal; combine the first phase modulated signal and the second phase modulated signal as a combined complementary phase modulated signal; and/or output the combined complementary phase modulated signal.

The low pass filter (LPF) 118 may be configured to: receive the combined complementary phase modulated signal; filter off harmonics produced by the first and second final output amplifiers while providing a predetermined amount of impedance to the combined complementary phase modulated signal; and/or output a filtered combined complementary phase modulated signal as a forward signal.

The directional coupler 120 may be configured to: receive the forward signal; sample the forward signal; and/or output the forward signal to the antenna 122. For example, the directional coupler 120 may be further configured to: sample the forward signal for monitoring feedback of an envelope of the modulated signal; and/or output a sample of the forward signal.

The input detector 126 may be configured to: receive the amplified RF drive; strip the envelope from the amplified RF drive; and output an input envelope of the amplified RF drive.

The feedback error amplifier 124 may be configured to: receive the sample of the forward signal and the input envelope of the amplified RF drive; compare an output envelope of the sample and the input envelope to create a difference signal; and/or output the difference signal.

The variable attenuator 128 may be configured to: receive the difference signal and the input envelope; correct an envelope amplitude based on the difference signal and the input envelope; and/or based on the corrected envelope amplitude, output the I to the first IQ modulator 108, the second IQ modulator 130, and the vector generator 132A.

In some embodiments, each of the first and second final output amplifiers 114 is a class D, E, or F amplifier.

For class D amplifiers, the operating principle behind Class D is based on switching transistors that are either fully turned on or fully turned off. Both transistors are never turned on at the same time and hence very little heat is generated. This type of amplifier is ideally 100% efficient.

For class E amplifiers, the transistor operates as an on/off switch like Class D. A load network shapes the voltage and current waveforms to prevent simultaneous high voltage and high current in the transistor. This minimizes power dissipation, especially during the switching transitions. This type of amplifier is also ideally 100% efficient if simultaneous current and voltage on the transistor never occurs.

For class F amplifiers, the Class F power amplifier uses multiple harmonics resonator output filters to control the harmonic content of its drain-to source voltage and drain current waveforms, thereby shaping them to reduce the power dissipated by the transistor. This minimizes any simultaneous voltage and current at the transistor and maximizes efficiency.

Referring now to FIGS. 2A, 2B, 2C, and 2D, an exemplary embodiment of the system 100 according to the inventive concepts disclosed herein is depicted. The power amplifier 101 may include at least one input amplifier 104, at least one input limiter 106, at least one first IQ modulator 108, at least one first amplifier path (e.g., including at least one first squaring amplifier 110, at least one first squaring limiter 112, and/or at least one first final output amplifier 114), at least one second IQ modulator 130, at least one second amplifier path (e.g., including at least one second squaring amplifier 110, at least one second squaring limiter 112, and/or at least one second final output amplifier 114), at least one Q vector generator 132B, at least one output balanced transformer 116, at least one low pass filter 118, at least one directional coupler 120, at least one input detector 126, at least one feedback error amplifier 124, and/or at least one variable attenuator 128, some or all of which may be communicatively coupled at any given time.

The input amplifier 104 may be configured to: receive a radio frequency (RF) drive from the exciter 102; amplify the RF drive; and/or output an amplified RF drive, wherein the RF drive includes phase and envelope information of a modulated signal.

The input limiter 106 may be configured to: receive the amplified RF drive; cap the amplified RF drive to no more than a predetermined voltage; and/or output a capped amplified RF drive.

The first IQ modulator 108 may be configured to: receive the capped amplified RF drive; receive an I and a Q; based at least on the I and the Q, produce a zero degree to ninety degree variable phase shifted output signal that changes relative to an input envelope of an RF drive waveform of the RF drive; and/or output the zero degree to ninety degree variable phase shifted output signal.

The first amplifier path may be configured to: receive the zero degree to ninety degree variable phase shifted output signal; and output a first phase modulated signal. For example, the first amplifier path may include the first squaring amplifier 110, the first squaring limiter 112, and/or the first final output amplifier 114. The first squaring amplifier 110 may be configured to: receive the zero degree to ninety degree variable phase shifted output signal; amplify the zero degree to ninety degree variable phase shifted output signal; and/or output an amplified zero degree to ninety degree variable phase shifted output signal. The first squaring limiter 112 may be configured to: receive the amplified zero degree to ninety degree variable phase shifted output signal; square the amplified zero degree to ninety degree variable phase shifted output signal to provide a first square wave drive signal; and/or output the first square wave drive signal. The first final output amplifier 114 may be configured to: receive the first square wave drive signal; amplify the first square wave drive signal to provide the first phase modulated signal; and/or output the first phase modulated signal.

The second IQ modulator 130 may be configured to: receive the capped amplified RF drive; receive the I and a negative Q (−Q); based at least on the I and the −Q, produce a zero degree to negative ninety degree variable phase shifted output signal that changes relative to the input envelope of the RF drive waveform of the RF drive; and/or output the zero degree to negative ninety degree variable phase shifted output signal.

The second amplifier path may be configured to: receive the zero degree to negative ninety degree variable phase shifted output signal; and/or output a second phase modulated signal, wherein the second phase modulated signal is complementary to the first phase modulated signal. For example, the second amplifier path may include the second squaring amplifier 110, the second squaring limiter 112, and/or the second final output amplifier 114. The second squaring amplifier 110 may be configured to: receive the zero degree to negative ninety degree variable phase shifted output signal; amplify the zero degree to negative ninety degree variable phase shifted output signal; and/or output an amplified zero degree to negative ninety degree variable phase shifted output signal. The second squaring limiter 112 may be configured to: receive the amplified zero degree to negative ninety degree variable phase shifted output signal; square the amplified zero degree to negative ninety degree variable phase shifted output signal to provide a second square wave drive signal; and/or output the second square wave drive signal. The second final output amplifier 114 may be configured to: receive the second square wave drive signal; amplify the second square wave drive signal to provide the second phase modulated signal; and/or output the second phase modulated signal.

The Q vector generator 132B may be configured to: generate at least the Q and the −Q; output the Q to the first IQ modulator 108; and/or output the −Q to the second IQ modulator 130. In some embodiments, the Q vector generator 132A may be a digital Q vector generator. In some embodiments, the digital Q vector generator uses at least one of the following equations (shown in FIGS. 2B and 2C) to generate the Q and the −Q: 1) a first equation of $Q=\sqrt{1-I^2}$ (perfect amplitude linearity but non-linear phase); 2) a second equation of $Q=1-I$ (better phase linearity but poor amplitude linearity (3 dB variation)); or 3) a third equation of $$Q = \frac{A}{\tan\left(\frac{\pi A}{z}\right)}$$

Figure 2A:
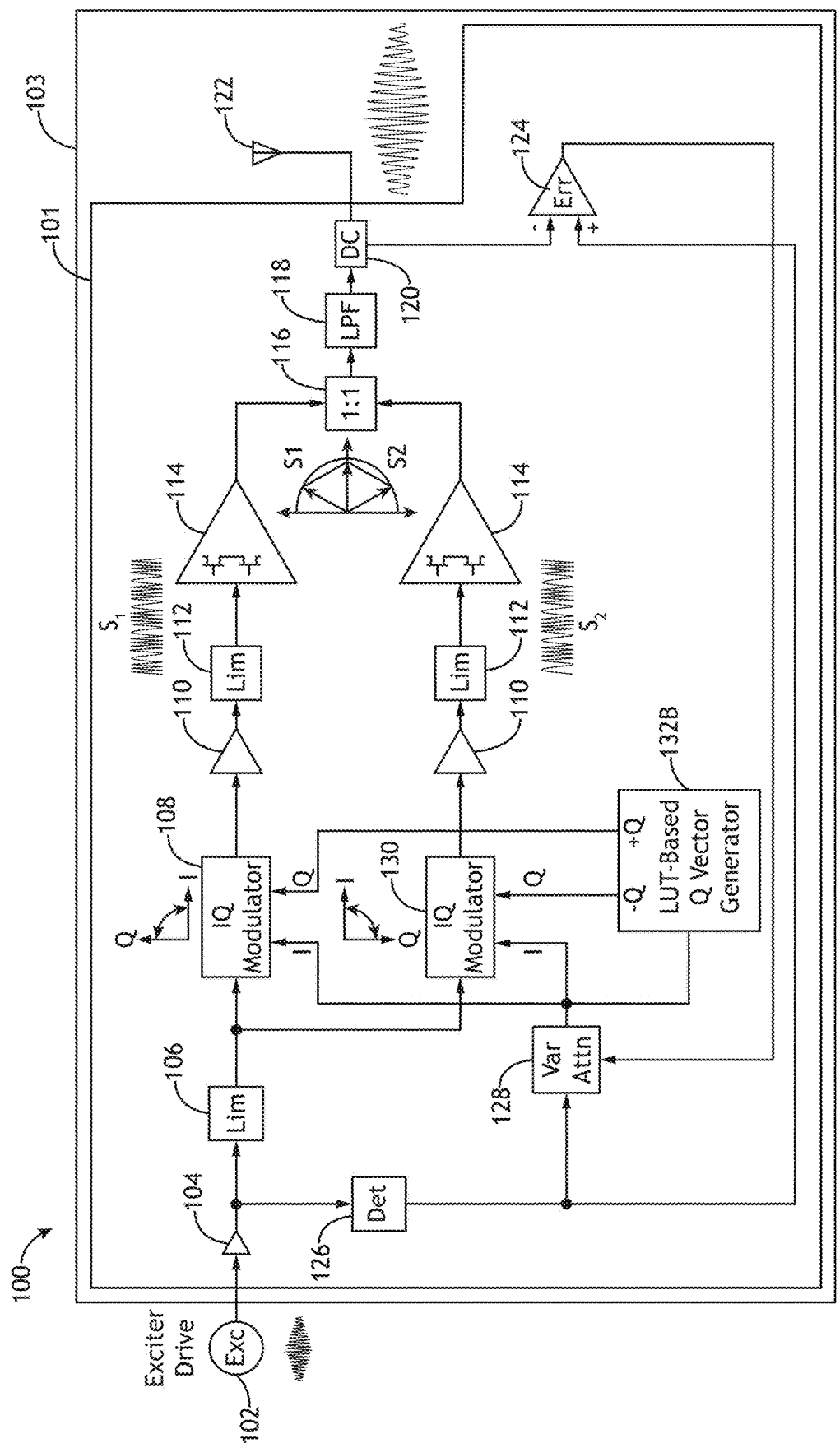
FIGS. 2A, 2B, 2C, and 2D show a view of an exemplary embodiment of a system including a processor and a GPU according to the inventive concepts disclosed herein.
Figure 2C:
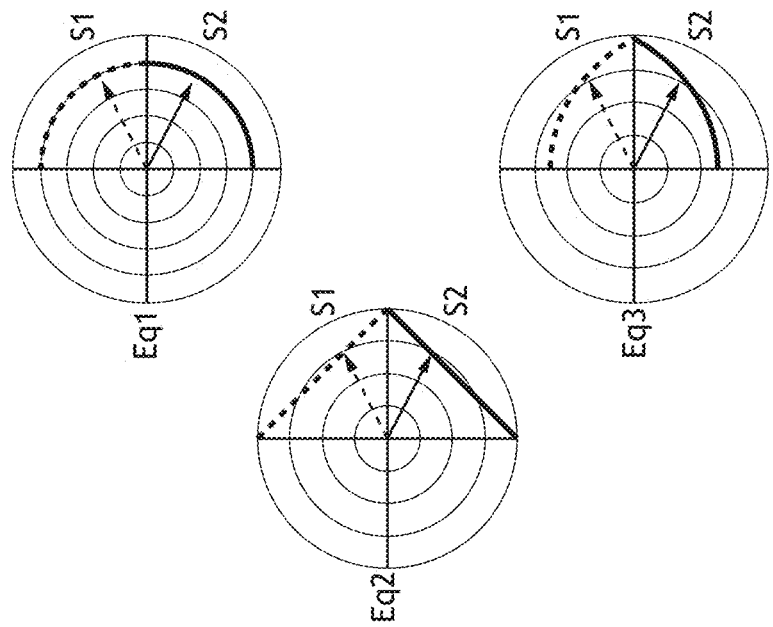
Figure 2B:
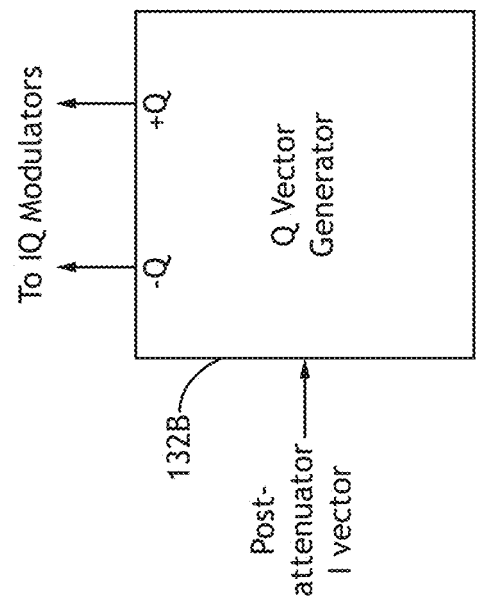
Figure 2D:
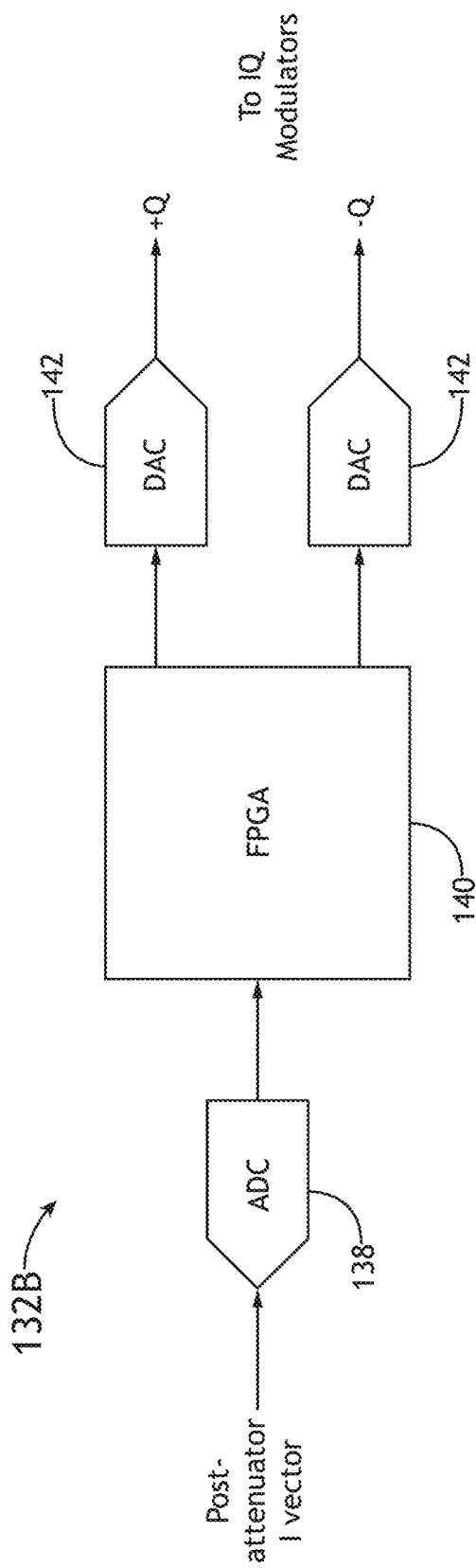

(perfect phase linearity and very poor amplitude linearity). In some embodiments, as shown in FIG. 2D, the digital Q vector generator may include at least one processor (e.g., at least one field-programmable gate array (FPGA) 140, at least one central processing unit (CPU), at least one digital signal processor, and/or at least one application specific integrated circuit (ASIC)), at least one analog-to-digital converter (ADC) 138, at least one digital-to-analog converter (DAC) 142, and/or memory (not shown), some or all of which may be communicatively coupled at any given time. Lookup tables, stored in on-processor memory or in connected external memory, may allow for rapid derivation of the Q vectors without requiring the digital circuitry to do any mathematical calculations. Feedback may still be used to correct for nonlinearities in the signal amplitude.

The output balanced transformer 116 may be configured to: receive the first phase modulated signal and the second phase modulated signal; combine the first phase modulated signal and the second phase modulated signal as a combined complementary phase modulated signal; and/or output the combined complementary phase modulated signal.

The low pass filter (LPF) 118 may be configured to: receive the combined complementary phase modulated signal; filter off harmonics produced by the first and second final output amplifiers while providing a predetermined amount of impedance to the combined complementary phase modulated signal; and/or output a filtered combined complementary phase modulated signal as a forward signal.

The directional coupler 120 may be configured to: receive the forward signal; sample the forward signal; and/or output the forward signal to the antenna 122. For example, the directional coupler 120 may be further configured to: sample the forward signal for monitoring feedback of an envelope of the modulated signal; and/or output a sample of the forward signal.

The input detector 126 may be configured to: receive the amplified RF drive; strip the envelope from the amplified RF drive; and output an input envelope of the amplified RF drive.

The feedback error amplifier 124 may be configured to: receive the sample of the forward signal and the input envelope of the amplified RF drive; compare an output envelope of the sample and the input envelope to create a difference signal; and/or output the difference signal.

The variable attenuator 128 may be configured to: receive the difference signal and the input envelope; correct an envelope amplitude based on the difference signal and the input envelope; and/or based on the corrected envelope amplitude, output the I to the first IQ modulator 108, the second IQ modulator 130, and the vector generator 132A.

In some embodiments, each of the first and second final output amplifiers 114 is a class D, E, or F amplifier.

Figure 3A:
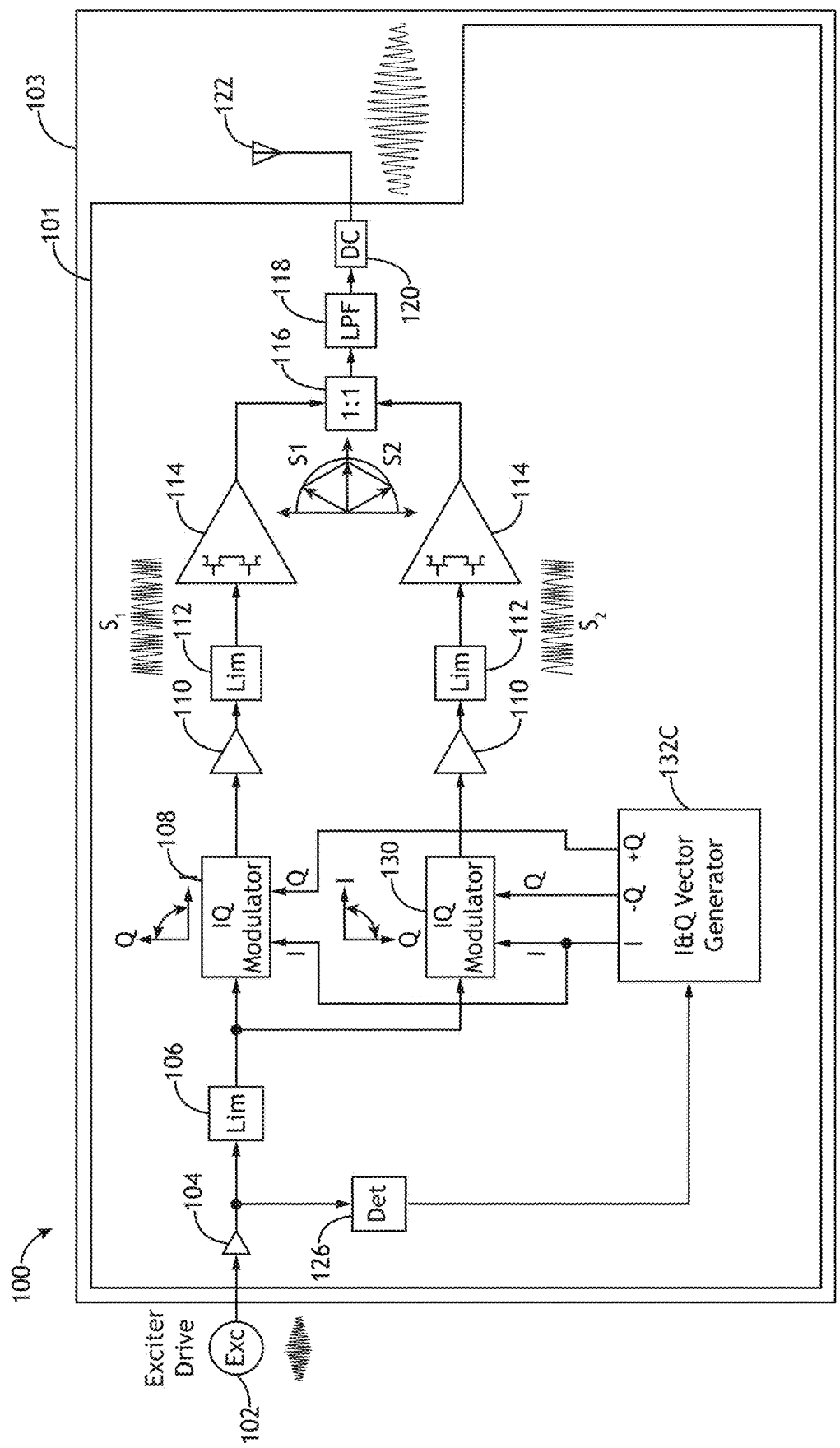
FIGS. 3A, 3B, and 3C show a view of an exemplary embodiment of a system including a processor and a GPU according to the inventive concepts disclosed herein.
Figure 3B:
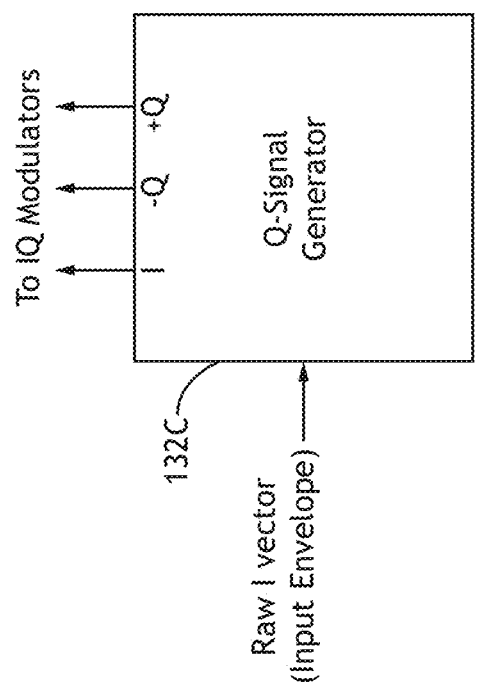
Figure 3C:
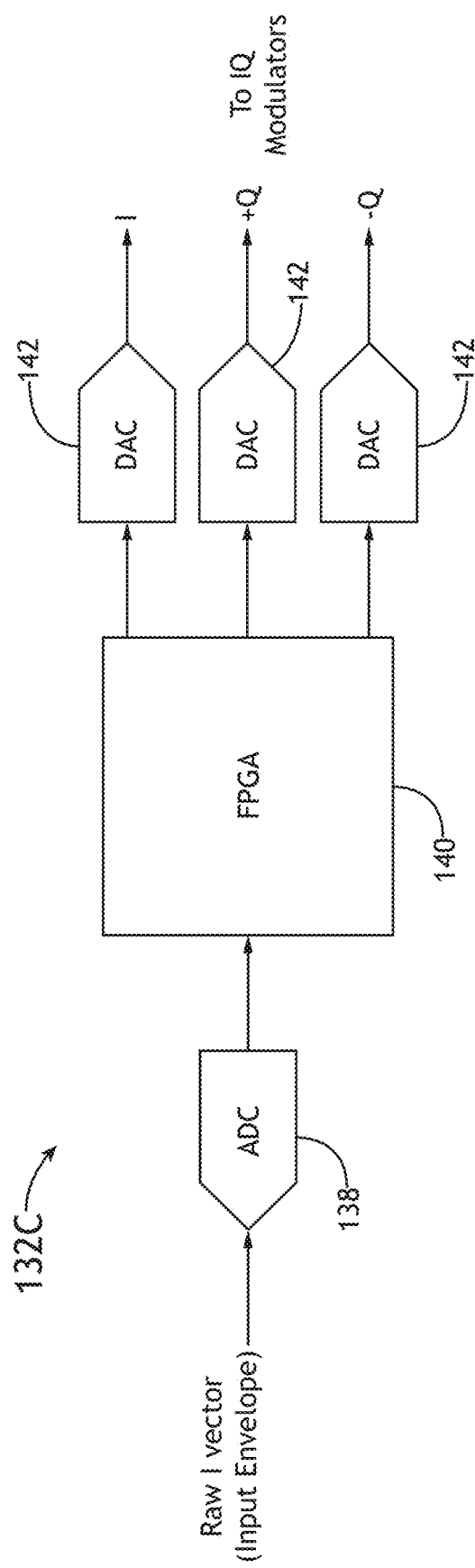

Referring now to FIGS. 3A, 3B, and 3C, an exemplary embodiment of the system 100 according to the inventive concepts disclosed herein is depicted. The power amplifier 101 may include at least one input amplifier 104, at least one input limiter 106, at least one first IQ modulator 108, at least one first amplifier path (e.g., including at least one first squaring amplifier 110, at least one first squaring limiter 112, and/or at least one first final output amplifier 114), at least one second IQ modulator 130, at least one second amplifier path (e.g., including at least one second squaring amplifier 110, at least one second squaring limiter 112, and/or at least one second final output amplifier 114), at least one I and Q vector generator 132C, at least one output balanced transformer 116, at least one low pass filter 118, at least one directional coupler 120, and/or at least one input detector 126, some or all of which may be communicatively coupled at any given time. In some embodiments, no envelope feedback is needed for linearization. In some embodiments, the power amplifier 101 may be pre-characterized during factory calibration for gain and phase response. In some embodiments, inverse gain and phase responses may be used to optimize I and Q vectors and linearize the power amplifier 101.

The input amplifier 104 may be configured to: receive a radio frequency (RF) drive from the exciter 102; amplify the RF drive; and/or output an amplified RF drive, wherein the RF drive includes phase and envelope information of a modulated signal.

The input limiter 106 may be configured to: receive the amplified RF drive; cap the amplified RF drive to no more than a predetermined voltage; and/or output a capped amplified RF drive.

The first IQ modulator 108 may be configured to: receive the capped amplified RF drive; receive an I and a Q; based at least on the I and the Q, produce a zero degree to ninety degree variable phase shifted output signal that changes relative to an input envelope of an RF drive waveform of the RF drive; and/or output the zero degree to ninety degree variable phase shifted output signal.

The first amplifier path may be configured to: receive the zero degree to ninety degree variable phase shifted output signal; and output a first phase modulated signal. For example, the first amplifier path may include the first squaring amplifier 110, the first squaring limiter 112, and/or the first final output amplifier 114. The first squaring amplifier 110 may be configured to: receive the zero degree to ninety degree variable phase shifted output signal; amplify the zero degree to ninety degree variable phase shifted output signal; and/or output an amplified zero degree to ninety degree variable phase shifted output signal. The first squaring limiter 112 may be configured to: receive the amplified zero degree to ninety degree variable phase shifted output signal; square the amplified zero degree to ninety degree variable phase shifted output signal to provide a first square wave drive signal; and/or output the first square wave drive signal. The first final output amplifier 114 may be configured to: receive the first square wave drive signal; amplify the first square wave drive signal to provide the first phase modulated signal; and/or output the first phase modulated signal.

The second IQ modulator 130 may be configured to: receive the capped amplified RF drive; receive the I and a negative Q (−Q); based at least on the I and the −Q, produce a zero degree to negative ninety degree variable phase shifted output signal that changes relative to the input envelope of the RF drive waveform of the RF drive; and/or output the zero degree to negative ninety degree variable phase shifted output signal.

The second amplifier path may be configured to: receive the zero degree to negative ninety degree variable phase shifted output signal; and/or output a second phase modulated signal, wherein the second phase modulated signal is complementary to the first phase modulated signal. For example, the second amplifier path may include the second squaring amplifier 110, the second squaring limiter 112, and/or the second final output amplifier 114. The second squaring amplifier 110 may be configured to: receive the zero degree to negative ninety degree variable phase shifted output signal; amplify the zero degree to negative ninety degree variable phase shifted output signal; and/or output an amplified zero degree to negative ninety degree variable phase shifted output signal. The second squaring limiter 112 may be configured to: receive the amplified zero degree to negative ninety degree variable phase shifted output signal; square the amplified zero degree to negative ninety degree variable phase shifted output signal to provide a second square wave drive signal; and/or output the second square wave drive signal. The second final output amplifier 114 may be configured to: receive the second square wave drive signal; amplify the second square wave drive signal to provide the second phase modulated signal; and/or output the second phase modulated signal.

The I and Q vector generator 132C may be configured to: generate at least the Q and the −Q; output the Q to the first IQ modulator 108; and/or output the −Q to the second IQ modulator 130. In some embodiments, the I and Q vector generator 132C may be a digital I and Q vector generator. The digital I and Q vector generator may be configured to: receive the input envelope of the amplified RF drive; based at least on the input envelope of the amplified RF drive, generate the I; output the I; and generate the Q and the −Q through use of at least one of: 1) a first equation of $Q=\sqrt{1-I^2}$; 2) a second equation of $Q=1-I$ to generate the Q and the −Q; or 3) a third equation of $$Q = \frac{A}{\tan\left(\frac{\pi A}{z}\right)}.$$

In some embodiments, as shown in FIGS. 3B and 3C, the digital I and Q vector generator may include at least one processor (e.g., at least one field-programmable gate array (FPGA) 140, at least one central processing unit (CPU), at least one digital signal processor, and/or at least one application specific integrated circuit (ASIC)), at least one analog-to-digital converter (ADC) 138, at least one digital-to-analog converter (DAC) 142, and/or memory (not shown), some or all of which may be communicatively coupled at any given time. Lookup tables, stored in on-processor memory or in connected external memory, may allow for rapid derivation of the Q vectors without requiring the digital circuitry to do any mathematical calculations. In some embodiments, no feedback is required for this approach, as all the linearization is performed through pre-characterization of the power amplifier 101 during production. Once the gain and phase have been characterized, an inverse gain and phase response is established that counteracts the nonlinearities in the I and Q vectors.

The output balanced transformer 116 may be configured to: receive the first phase modulated signal and the second phase modulated signal; combine the first phase modulated signal and the second phase modulated signal as a combined complementary phase modulated signal; and/or output the combined complementary phase modulated signal.

The low pass filter (LPF) 118 may be configured to: receive the combined complementary phase modulated signal; filter off harmonics produced by the first and second final output amplifiers while providing a predetermined amount of impedance to the combined complementary phase modulated signal; and/or output a filtered combined complementary phase modulated signal as a forward signal.

The directional coupler 120 may be configured to: receive the forward signal; sample the forward signal; and/or output the forward signal to the antenna 122. For example, the directional coupler 120 may be further configured to: sample the forward signal to monitor power of the forward signal; and/or output a sample of the forward signal.

The input detector 126 may be configured to: receive the amplified RF drive; strip the envelope from the amplified RF drive; and output an input envelope of the amplified RF drive.

In some embodiments, each of the first and second final output amplifiers 114 is a class D, E, or F amplifier.

Figure 4A:
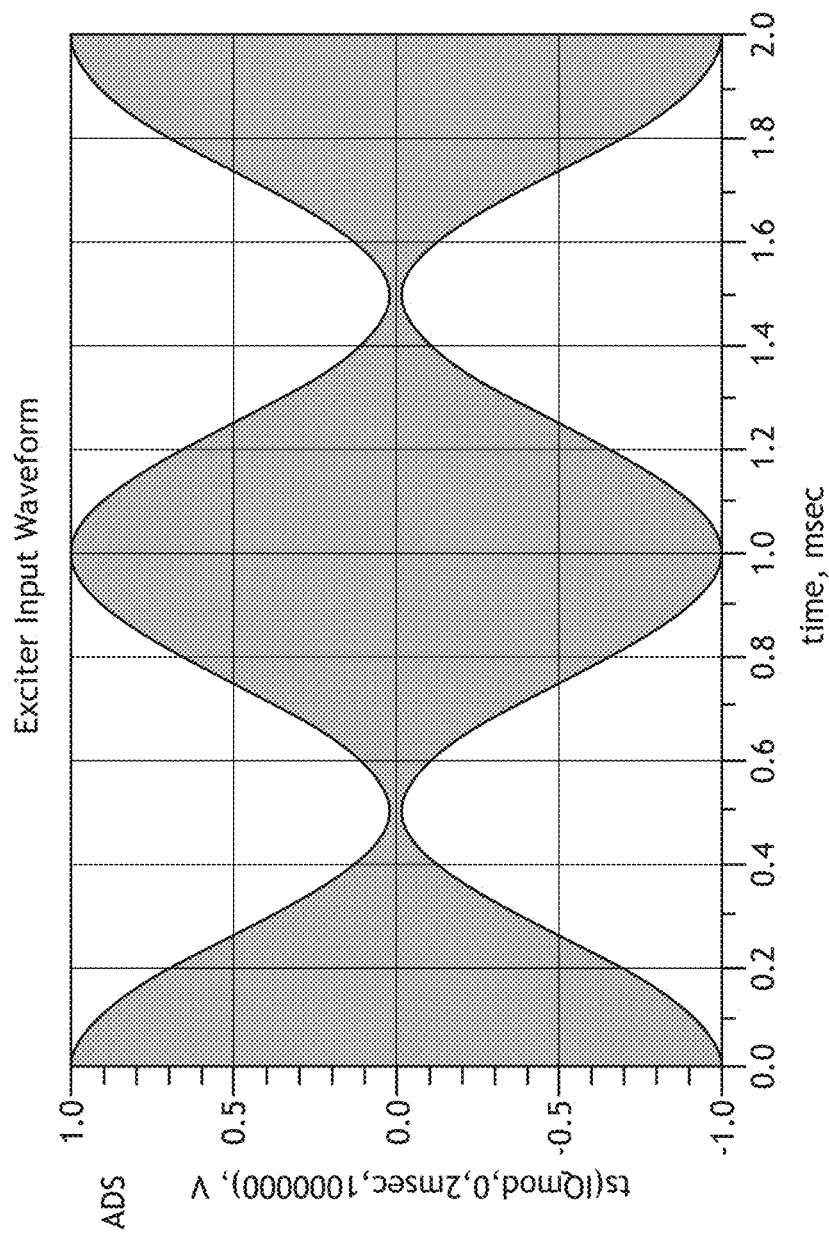
FIGS. 4A, 4B, and 4C show performance graphs related to amplifying an AM signal of an exemplary embodiment of the power amplifier of FIG. 1A according to the inventive concepts disclosed herein.
Figure 4B:
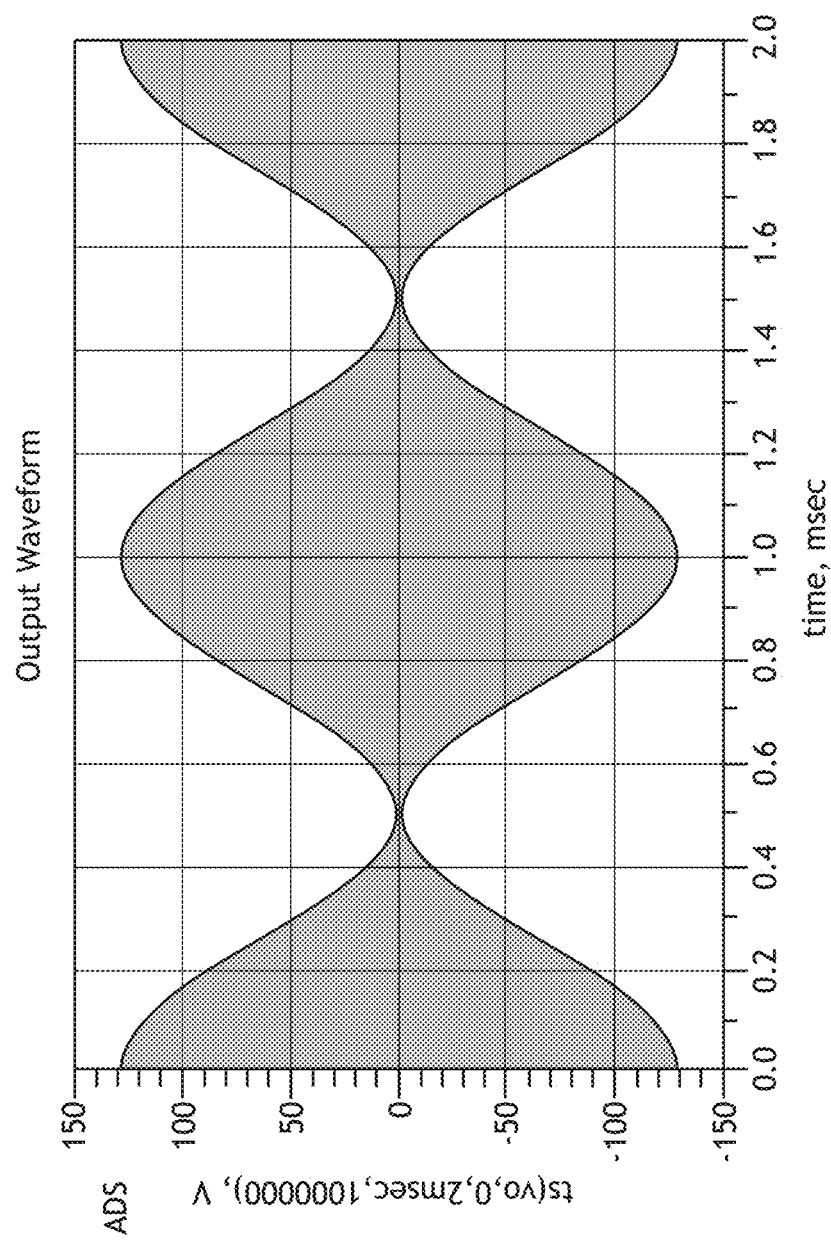
Figure 4C:
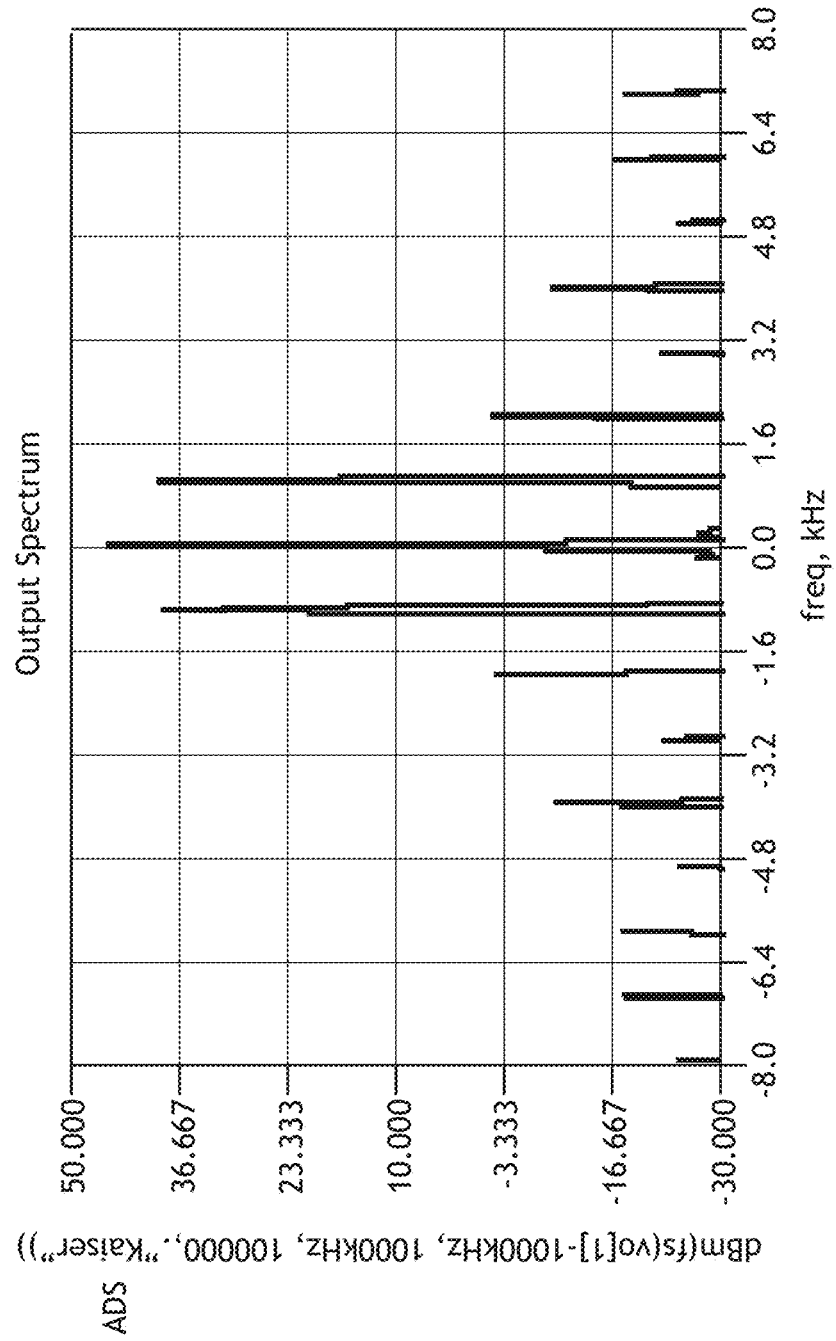

Referring now to FIGS. 4A, 4B, and 4C, performance graphs related to amplifying an AM signal of an exemplary embodiment of the power amplifier 100, which utilizes an analog Q vector generator (e.g., 132A) and performs better than current class AB amplifiers, according to the inventive concepts disclosed herein are depicted. FIG. 4A shows an exciter input waveform. FIG. 4B shows an output waveform. FIG. 4C shows an output spectrum. For example, peak power may be 159.480 watts, Peak-to-Average Power Ratio (PAPR) may be 4.121 dB, and max(PrcntAMdisto) (e.g., distortion level) may be 9.786%.

Figure 5A:
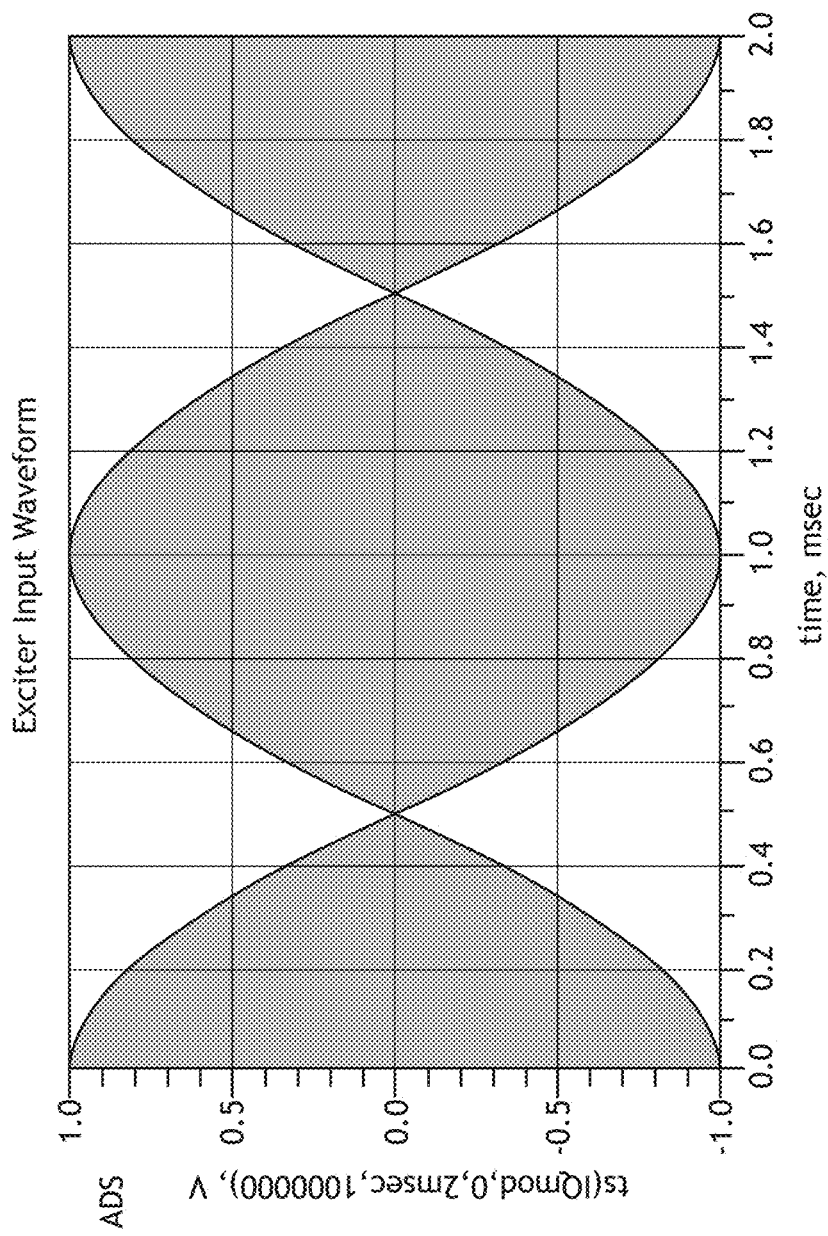
FIGS. 5A, 5B, and 5C show performance graphs related to amplifying a single-sideband signal of an exemplary embodiment of the power amplifier of FIG. 1A according to the inventive concepts disclosed herein.
Figure 5B:
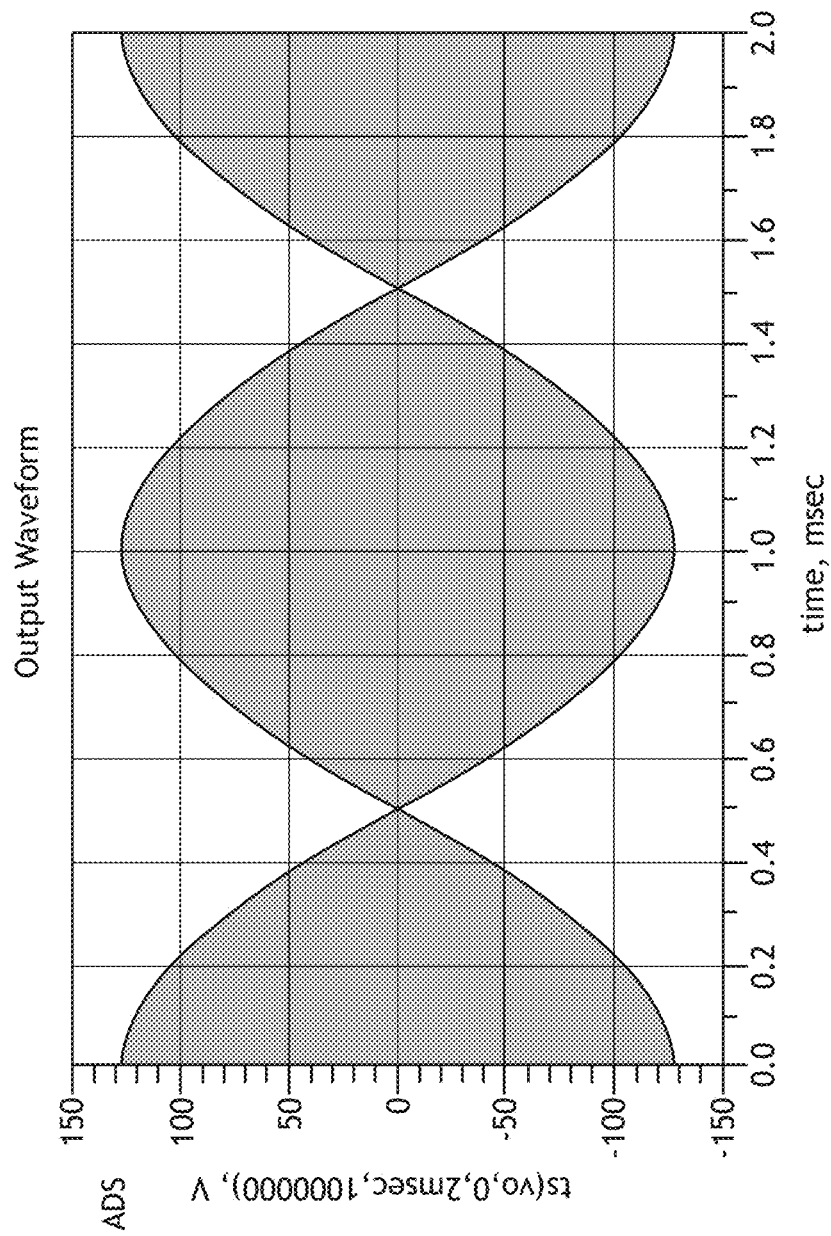
Figure 5C:
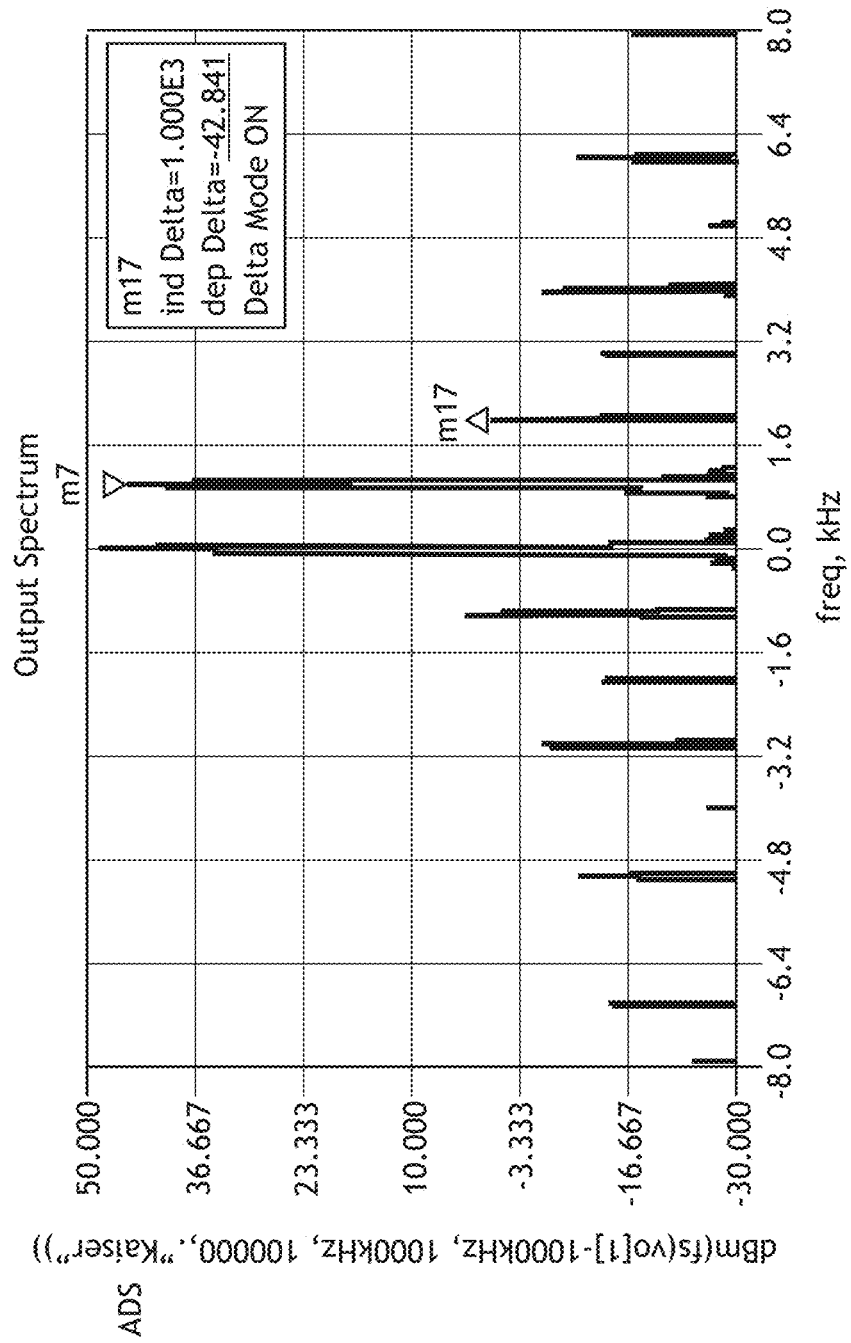

Referring now to FIGS. 5A, 5B, and 5C, performance graphs related to amplifying a single-sideband signal (e.g., commonly used in high frequency (HF) communications) of an exemplary embodiment of the power amplifier 100, which utilizes an analog Q vector generator (e.g., 132A) and performs better than current class AB amplifiers, according to the inventive concepts disclosed herein are depicted. FIG. 5A shows an exciter input waveform. FIG. 5B shows an output waveform. FIG. 5C shows an output spectrum. For example, peak power may be 159.477 watts, PAPR may be 2.886 dB, and intermodulation distortion (IMD) may be −42.841 dB.

Figure 6:
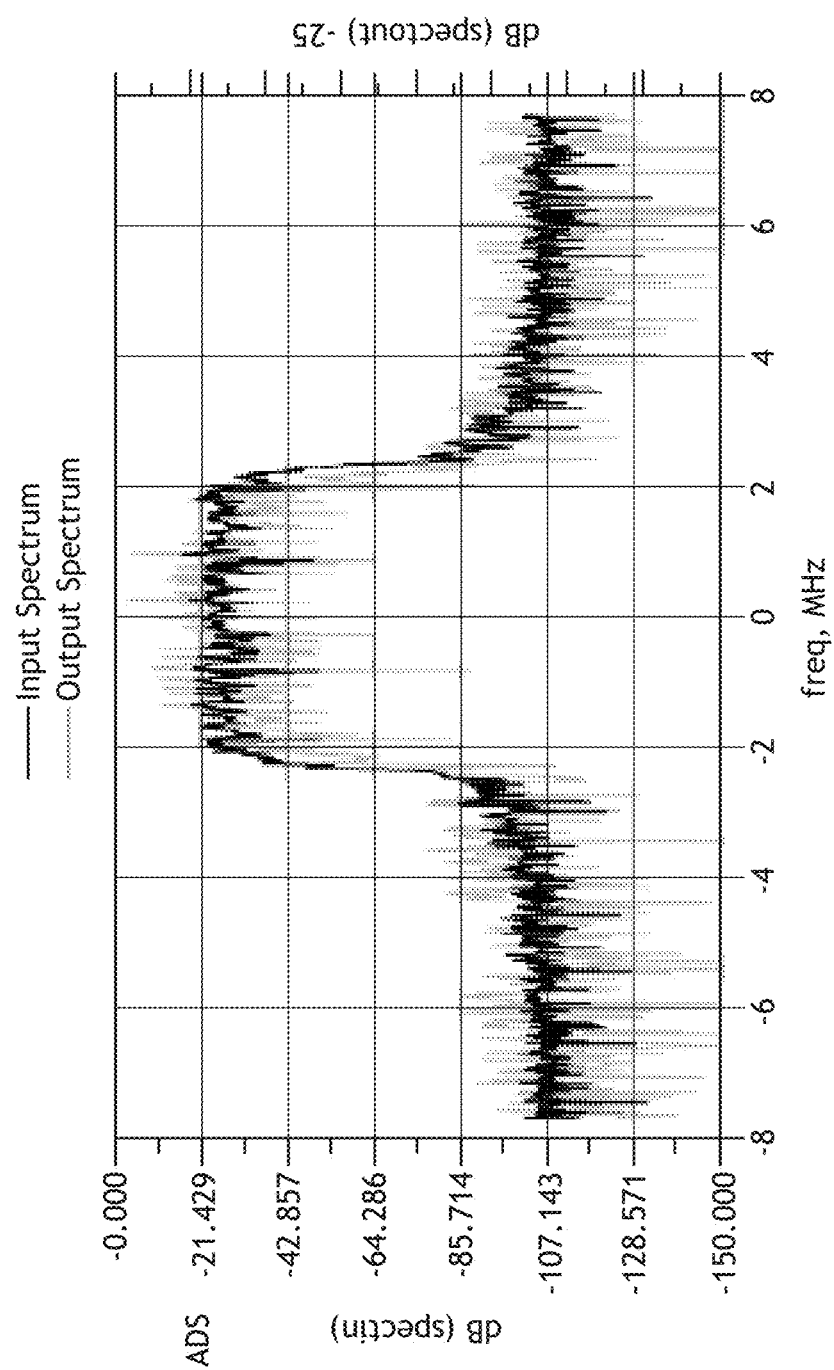
FIG. 6 shows a performance graph related to amplifying a $3^{rd}$ Generation Partnership Program (3GPP) and/or Mobile User Objective System (MUOS) waveform signal of an exemplary embodiment of the power amplifier of FIG. 1A according to the inventive concepts disclosed herein.

Referring now to FIG. 6, a performance graph related to amplifying a $3^{rd}$ Generation Partnership Program (3GPP) and/or Mobile User Objective System (MUOS) waveform signal of an exemplary embodiment of the power amplifier 100, which utilizes an analog Q vector generator (e.g., 132A) and performs better than current class AB amplifiers, according to the inventive concepts disclosed herein are depicted. FIG. 6 shows an exciter input spectrum and an output spectrum. For example, Adjacent Channel Leakage Ratio (ACLR) may be 34.927 dB.

Figure 7A:
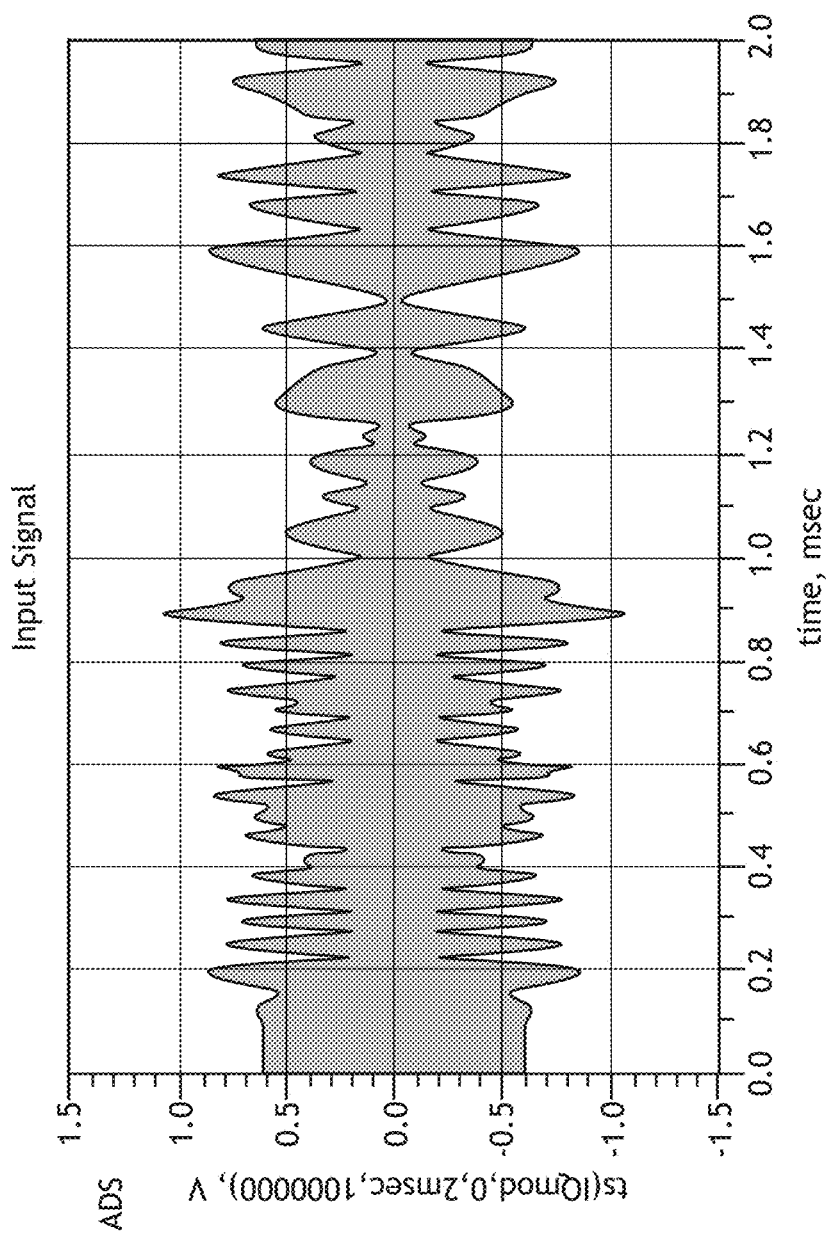
FIGS. 7A, 7B, 7C, 7D, 7E, and 7F show performance graphs related to amplifying a 256 quadrature amplitude modulation (QAM) (256 QAM) signal of an exemplary embodiment of the power amplifier of FIG. 1A according to the inventive concepts disclosed herein.
Figure 7B:
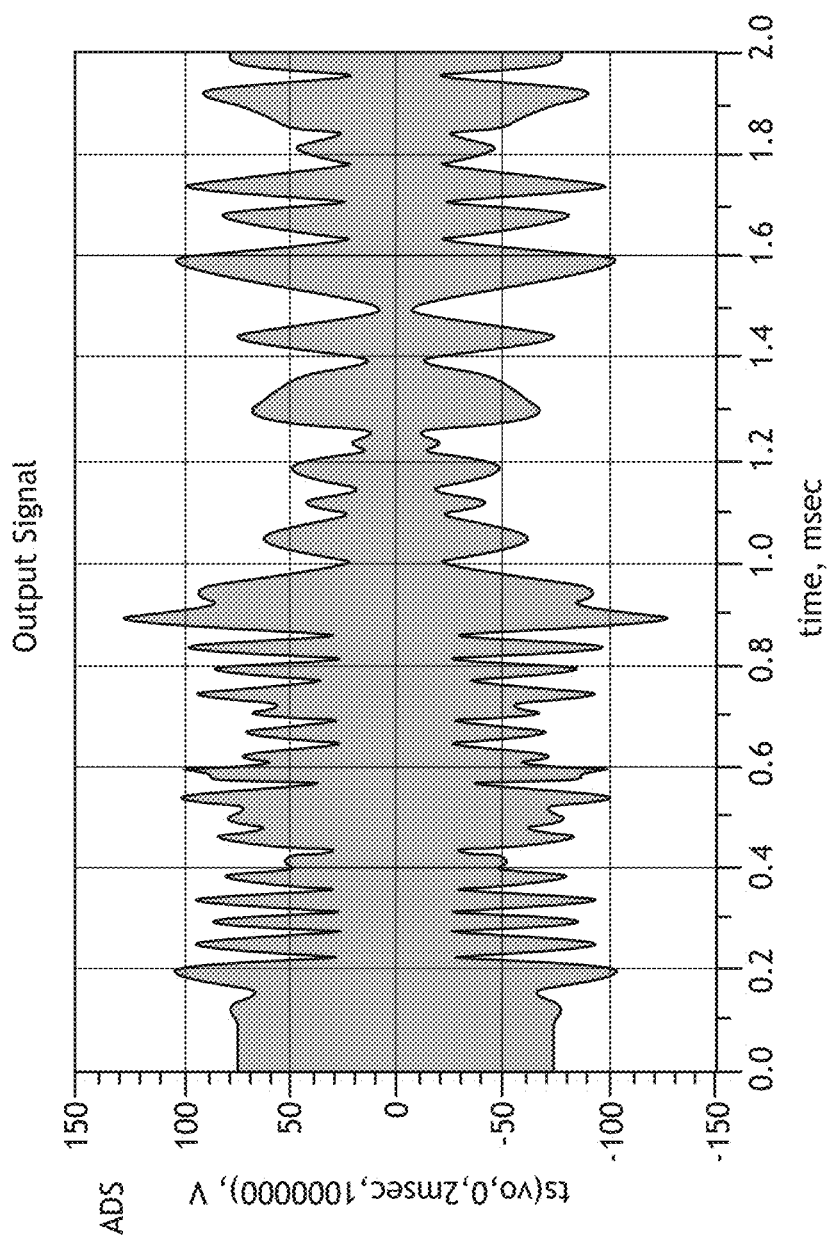
Figure 7C:
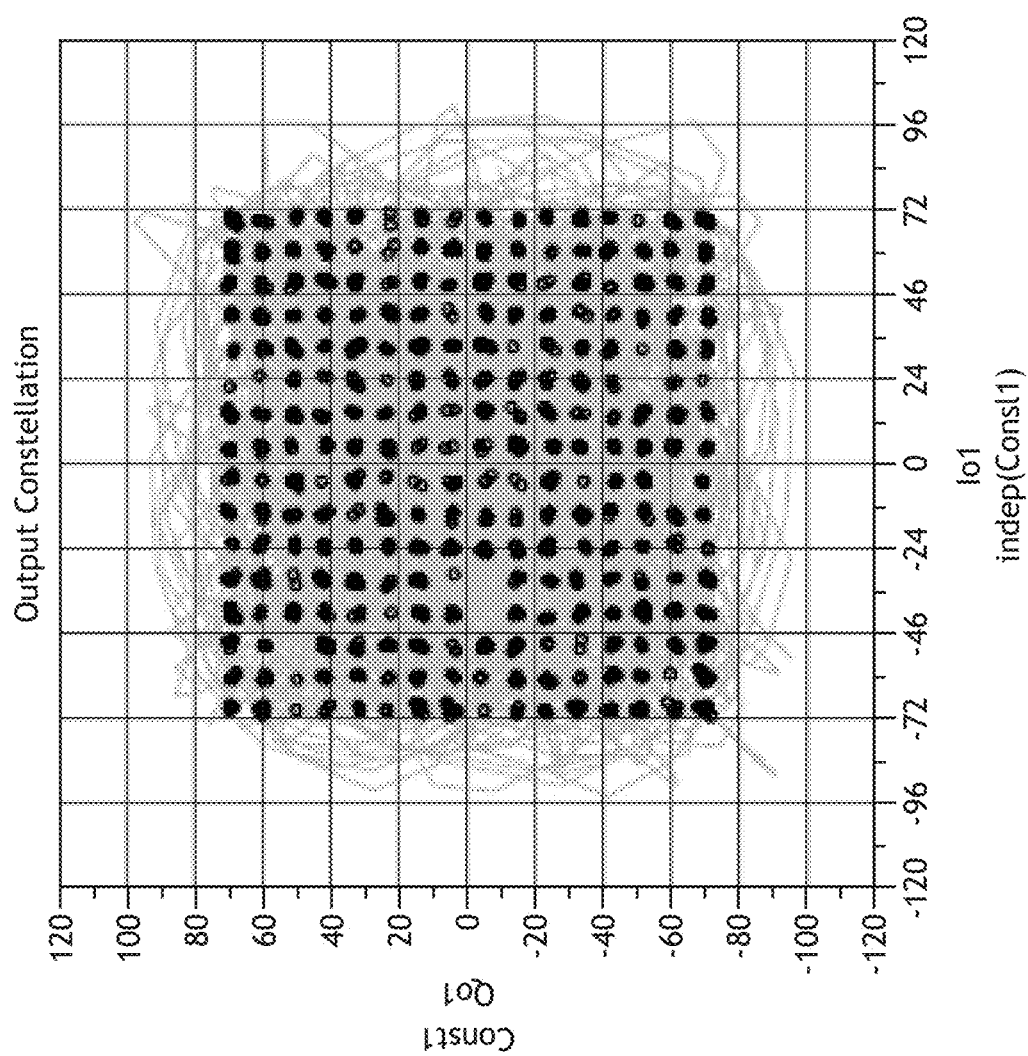
Figure 7D:
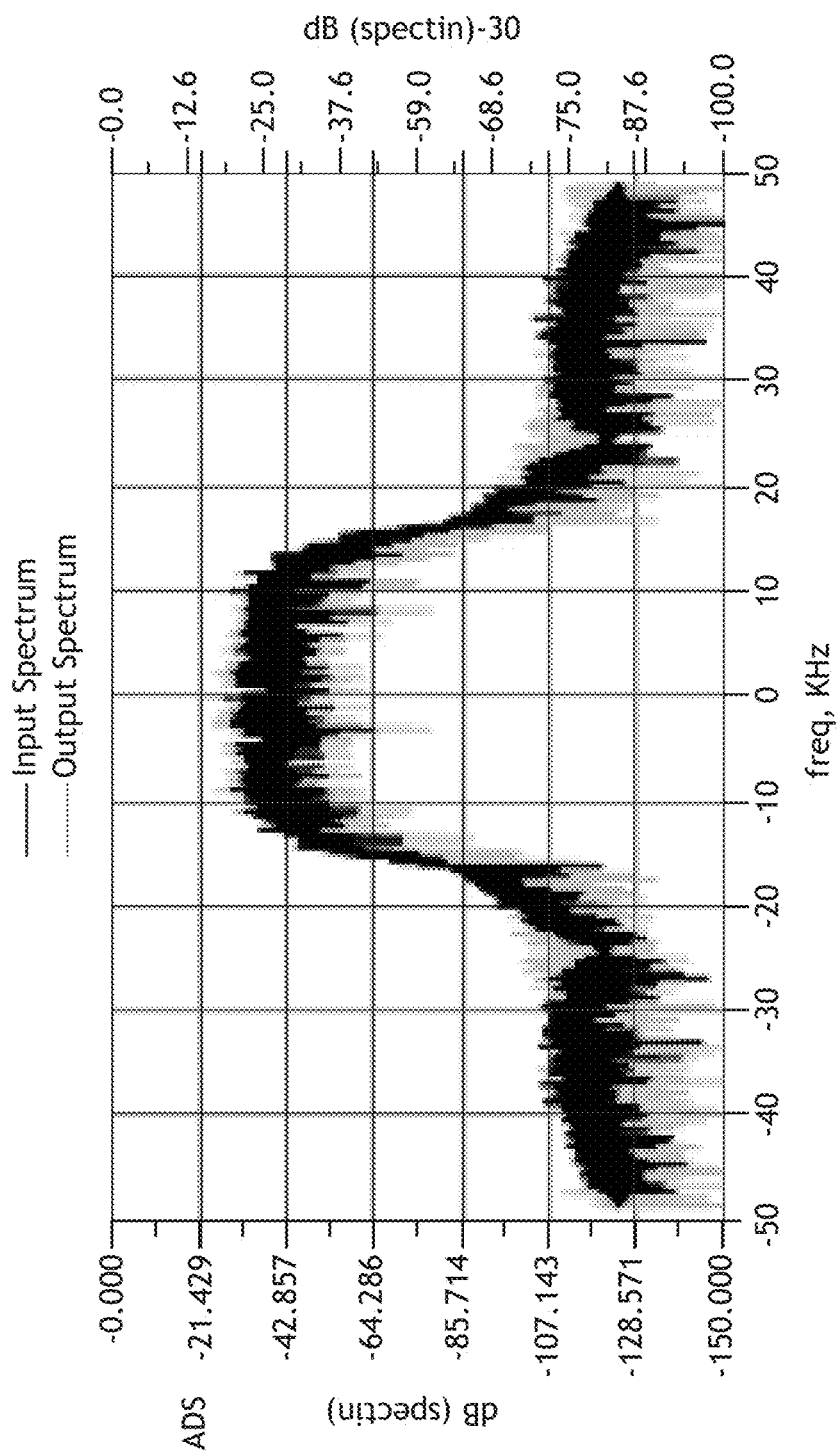
Figure 7E:
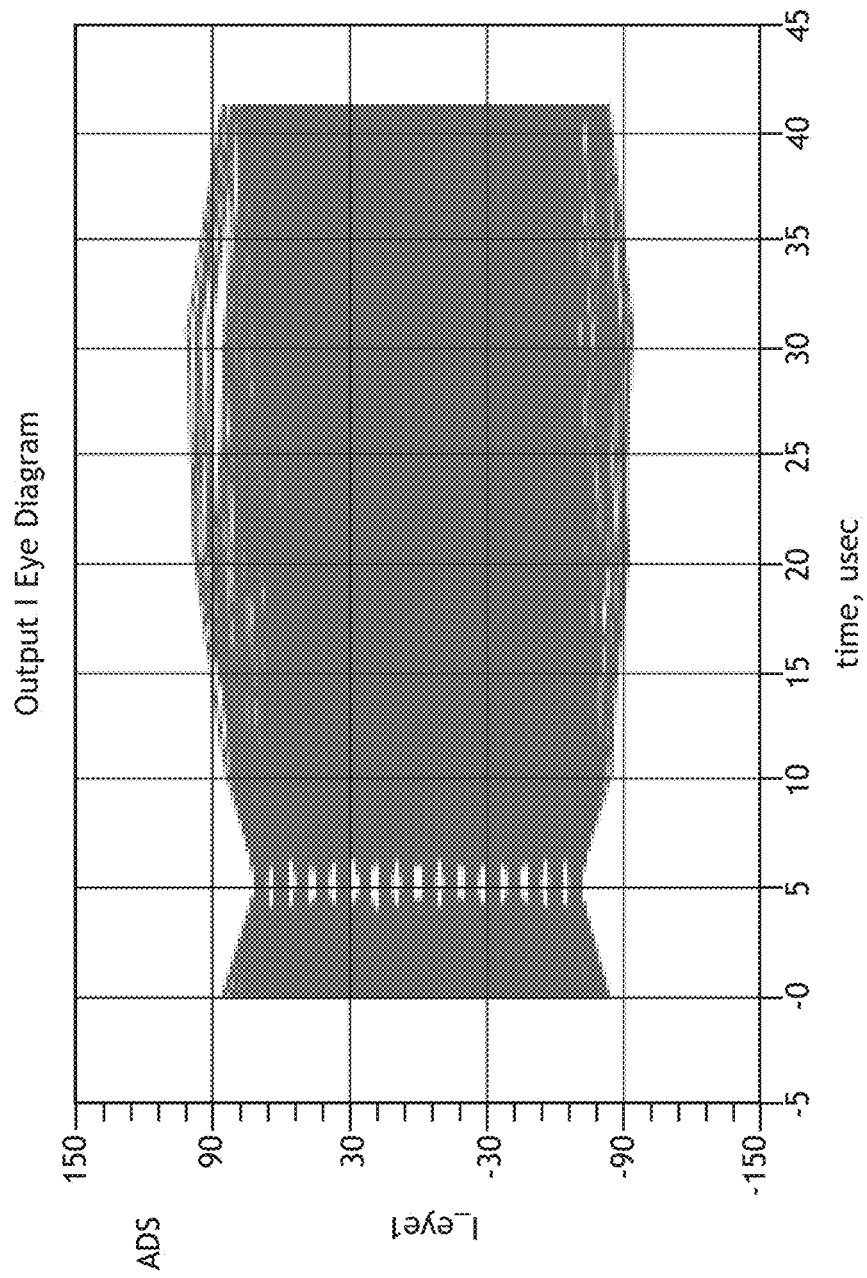
Figure 7F:
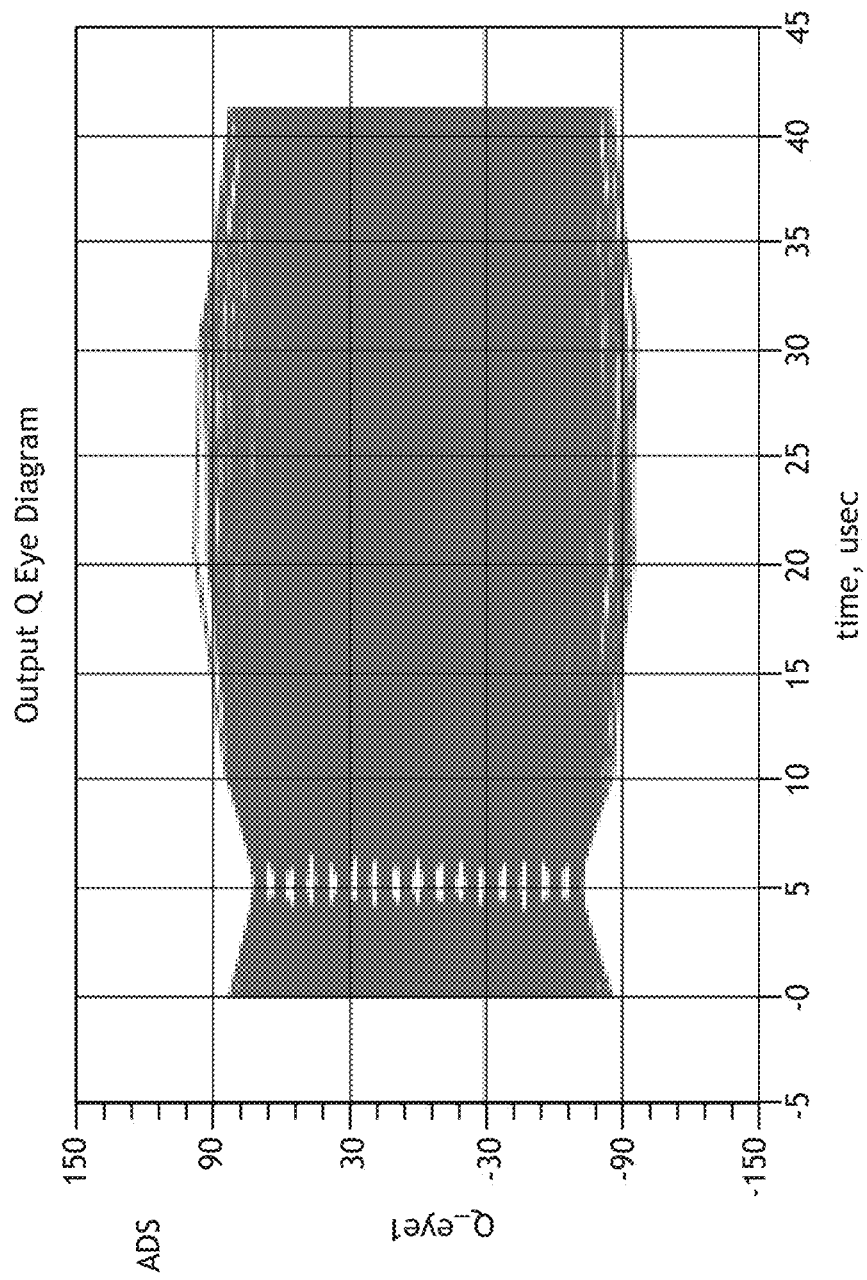

Referring now to FIGS. 7A, 7B, 7C, 7D, 7E, and 7F, performance graphs related to amplifying a 256 quadrature amplitude modulation (QAM) (256 QAM) signal of an exemplary embodiment of the power amplifier 100, which utilizes an analog Q vector generator (e.g., 132A) and performs at least as well as current class D amplifiers, according to the inventive concepts disclosed herein are depicted. FIG. 7A shows an exciter input waveform. FIG. 7B shows an output waveform. FIG. 7C shows an output constellation. FIG. 7D shows an input spectrum and an output spectrum. FIG. 6E shows an output I eye diagram. FIG. 6E shows an output Q eye diagram. For example, peak power may be 159.098 watts, and PAPR may be 6.477 dB.

Figure 8:
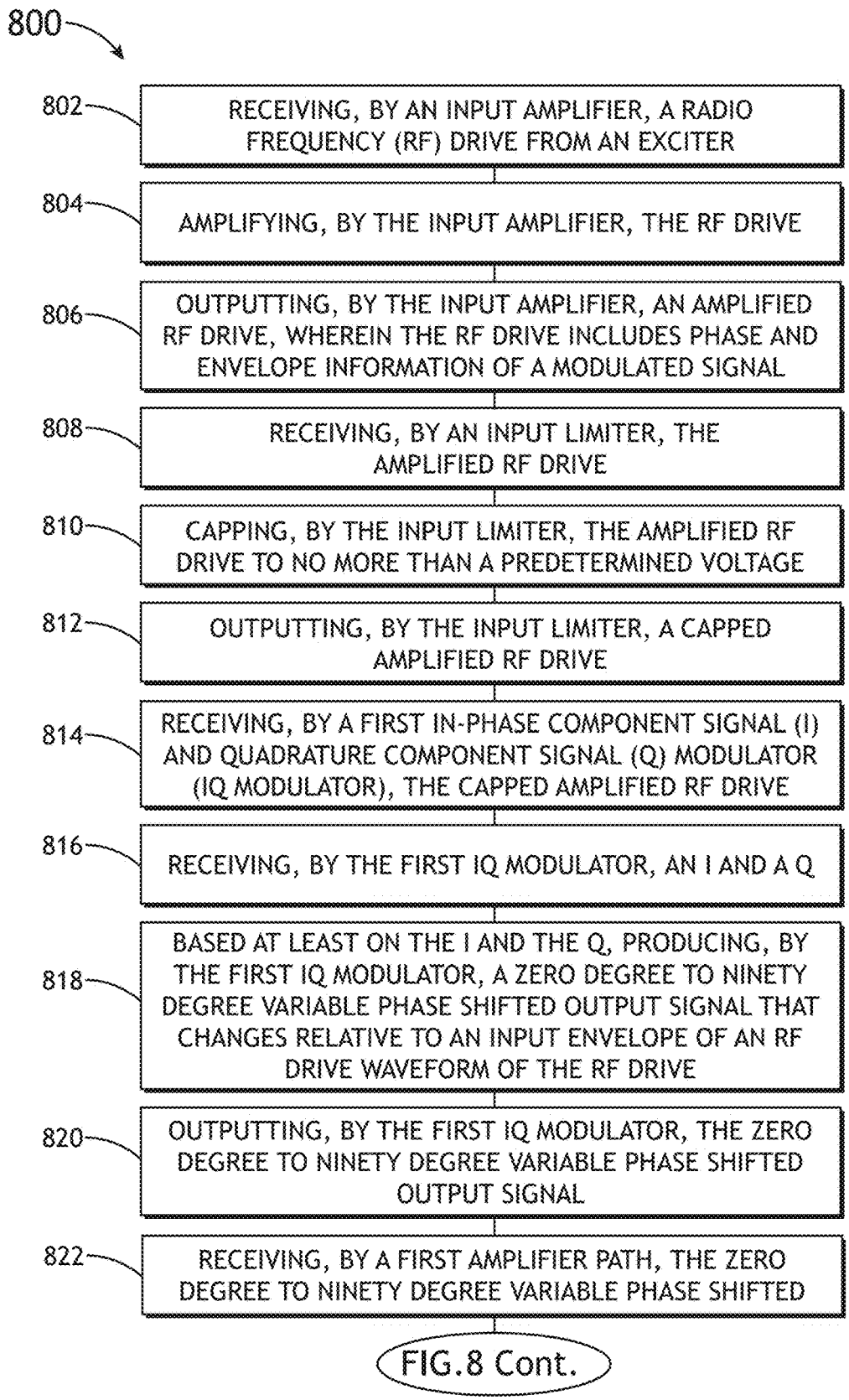
FIG. 8 is a diagram of an exemplary embodiment of a method according to the inventive concepts disclosed herein.
Figure 8:
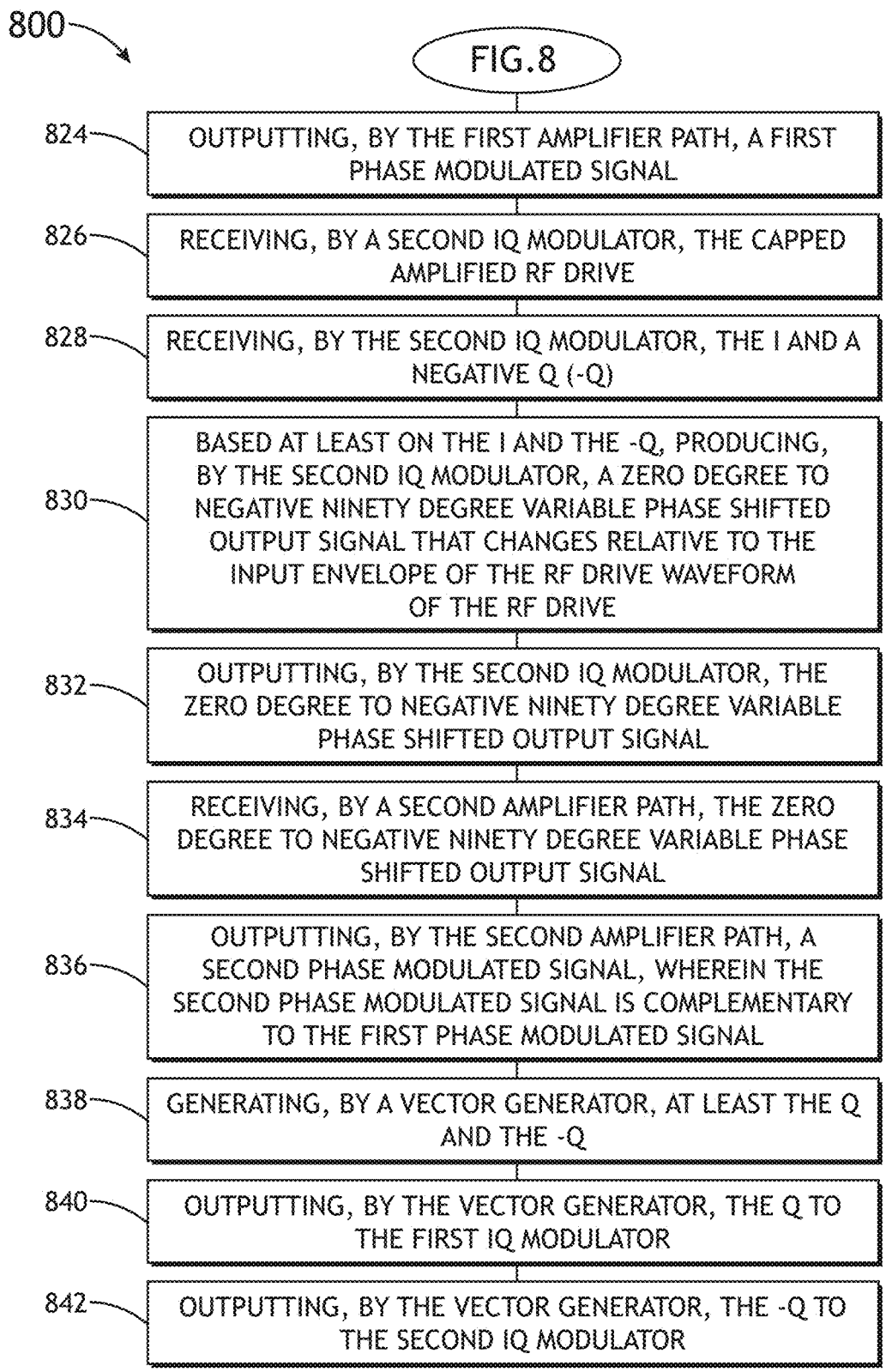

Referring now to FIG. 8, an exemplary embodiment of a method 800 according to the inventive concepts disclosed herein may include one or more of the following steps. Additionally, for example, some embodiments may include performing one or more instances of the method 800 iteratively, concurrently, and/or sequentially. Additionally, for example, at least some of the steps of the method 800 may be performed in parallel and/or concurrently. Additionally, in some embodiments, at least some of the steps of the method 800 may be performed non-sequentially.

A step 802 may include receiving, by an input amplifier, a radio frequency (RF) drive from an exciter.

A step 804 may include amplifying, by the input amplifier, the RF drive.

A step 806 may include outputting, by the input amplifier, an amplified RF drive, wherein the RF drive includes phase and envelope information of a modulated signal.

A step 808 may include receiving, by an input limiter, the amplified RF drive.

A step 810 may include capping, by the input limiter, the amplified RF drive to no more than a predetermined voltage.

A step 812 may include outputting, by the input limiter, a capped amplified RF drive.

A step 814 may include receiving, by a first in-phase component signal (I) and quadrature component signal (Q) modulator (IQ modulator), the capped amplified RF drive.

A step 816 may include receiving, by the first IQ modulator, an I and a Q.

A step 818 may include based at least on the I and the Q, producing, by the first IQ modulator, a zero degree to ninety degree variable phase shifted output signal that changes relative to an input envelope of an RF drive waveform of the RF drive.

A step 820 may include outputting, by the first IQ modulator, the zero degree to ninety degree variable phase shifted output signal.

A step 822 may include receiving, by a first amplifier path, the zero degree to ninety degree variable phase shifted output signal.

A step 824 may include outputting, by the first amplifier path, a first phase modulated signal.

A step 826 may include receiving, by a second IQ modulator, the capped amplified RF drive.

A step 828 may include o receiving, by the second IQ modulator, the I and a negative Q (−Q).

A step 830 may include based at least on the I and the −Q, producing, by the second IQ modulator, a zero degree to negative ninety degree variable phase shifted output signal that changes relative to the input envelope of the RF drive waveform of the RF drive.

A step 832 may include outputting, by the second IQ modulator, the zero degree to negative ninety degree variable phase shifted output signal.

A step 834 may include receiving, by a second amplifier path, the zero degree to negative ninety degree variable phase shifted output signal.

A step 836 may include outputting, by the second amplifier path, a second phase modulated signal, wherein the second phase modulated signal is complementary to the first phase modulated signal.

A step 838 may include generating, by a vector generator, at least the Q and the −Q.

A step 840 may include outputting, by the vector generator, the Q to the first IQ modulator.

A step 842 may include outputting, by the vector generator, the −Q to the second IQ modulator.

Further, the method 800 may include any of the operations disclosed throughout.

As will be appreciated from the above, embodiments of the inventive concepts disclosed herein may be directed to a method and a system including a power amplifier (e.g., outphasing power amplifier (e.g., full-bridge outphasing power amplifier)), wherein the power amplifier may include a vector generator (e.g., a Q vector generator or an I and Q vector generator) and IQ modulators.

As used throughout and as would be appreciated by those skilled in the art, "at least one non-transitory computer-readable medium" may refer to as at least one non-transitory computer-readable medium (e.g., memory, graphics memory, and/or storage; e.g., at least one computer-readable medium implemented as hardware; e.g., at least one non-transitory processor-readable medium, at least one memory (e.g., at least one nonvolatile memory, at least one volatile memory, or a combination thereof; e.g., at least one random-access memory, at least one flash memory, at least one read-only memory (ROM) (e.g., at least one electrically erasable programmable read-only memory (EEPROM)), at least one on-processor memory (e.g., at least one on-processor cache, at least one on-processor buffer, at least one on-processor flash memory, at least one on-processor EEPROM, or a combination thereof), or a combination thereof), at least one storage device (e.g., at least one hard-disk drive, at least one tape drive, at least one solid-state drive, at least one flash drive, at least one readable and/or writable disk of at least one optical drive configured to read from and/or write to the at least one readable and/or writable disk, or a combination thereof), or a combination thereof).

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more. Further, as used throughout, "zero or more" means zero, one, or a plurality of; for example, "zero or more" may comprise zero, one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A system, comprising:
an input amplifier configured to: receive a radio frequency (RF) drive from an exciter; amplify the RF drive; and output an amplified RF drive, wherein the RF drive includes phase and envelope information of a modulated signal;
an input limiter configured to: receive the amplified RF drive; cap the amplified RF drive to no more than a predetermined voltage; and output a capped amplified RF drive;
a first in-phase component signal (I) and quadrature component signal (Q) modulator (IQ modulator) configured to: receive the capped amplified RF drive; receive an I and a Q; based at least on the I and the Q, produce a zero degree to ninety degree variable phase shifted output signal that changes relative to an input envelope of an RF drive waveform of the RF drive; and output the zero degree to ninety degree variable phase shifted output signal;
a first amplifier path configured to: receive the zero degree to ninety degree variable phase shifted output signal; and output a first phase modulated signal;
a second IQ modulator configured to: receive the capped amplified RF drive; receive the I and a negative Q (–Q); based at least on the I and the –Q, produce a zero degree to negative ninety degree variable phase shifted output signal that changes relative to the input envelope of the RF drive waveform of the RF drive; and output the zero degree to negative ninety degree variable phase shifted output signal;
a second amplifier path configured to: receive the zero degree to negative ninety degree variable phase shifted output signal; and output a second phase modulated signal, wherein the second phase modulated signal is complementary to the first phase modulated signal; and
a vector generator configured to: generate at least the Q and the –Q; output the Q to the first IQ modulator; and output the –Q to the second IQ modulator.

2. The system of claim 1,
wherein the first amplifier path comprises a first squaring amplifier, a first squaring limiter, and a first final output amplifier;
wherein the first squaring amplifier is configured to: receive the zero degree to ninety degree variable phase shifted output signal; amplify the zero degree to ninety degree variable phase shifted output signal; and output an amplified zero degree to ninety degree variable phase shifted output signal;
wherein the first squaring limiter is configured to: receive the amplified zero degree to ninety degree variable phase shifted output signal; square the amplified zero degree to ninety degree variable phase shifted output signal to provide a first square wave drive signal; and output the first square wave drive signal;
wherein the first final output amplifier is configured to: receive the first square wave drive signal; amplify the first square wave drive signal to provide the first phase modulated signal; and output the first phase modulated signal;
wherein the second amplifier path comprises a second squaring amplifier, a second squaring limiter, and a second final output amplifier;
wherein the second squaring amplifier is configured to: receive the zero degree to negative ninety degree variable phase shifted output signal; amplify the zero degree to negative ninety degree variable phase shifted output signal; and output an amplified zero degree to negative ninety degree variable phase shifted output signal;
wherein the second squaring limiter is configured to: receive the amplified zero degree to negative ninety degree variable phase shifted output signal; square the amplified zero degree to negative ninety degree variable phase shifted output signal to provide a second square wave drive signal; and output the second square wave drive signal;
wherein the second final output amplifier is configured to: receive the second square wave drive signal; amplify the second square wave drive signal to provide the second phase modulated signal; and output the second phase modulated signal.

3. The system of claim 2, wherein each of the first and second final output amplifiers is a class D, E, or F amplifier.

4. The system of claim 2, further comprising an output balanced transformer configured to: receive the first phase modulated signal and the second phase modulated signal; combine the first phase modulated signal and the second phase modulated signal as a combined complementary phase modulated signal; and output the combined complementary phase modulated signal.

5. The system of claim 4, further comprising a low pass filter configured to: receive the combined complementary phase modulated signal; filter off harmonics produced by the first and second final output amplifiers while providing a predetermined amount of impedance to the combined complementary phase modulated signal; and output a filtered combined complementary phase modulated signal as a forward signal.

6. The system of claim 5, further comprising an antenna configured to: receive the forward signal; and transmit an RF signal based on the forward signal.

7. The system of claim 5, further comprising a directional coupler configured to: receive the forward signal; sample the forward signal; and output the forward signal to an antenna.

8. The system of claim 7, wherein the directional coupler is further configured to: sample the forward signal to monitor power of the forward signal.

9. The system of claim 7, wherein the directional coupler is further configured to: sample the forward signal for monitoring feedback of an envelope of the modulated signal; and output a sample of the forward signal.

10. The system of claim 9,
further comprising an input detector, a feedback error amplifier, and a variable attenuator;
wherein the input detector is configured to: receive the amplified RF drive; strip the envelope from the amplified RF drive; and output an input envelope of the amplified RF drive;
wherein the feedback error amplifier is configured to: receive the sample of the forward signal and the input envelope of the amplified RF drive; compare an output envelope of the sample and the input envelope to create a difference signal; and output the difference signal;
wherein the variable attenuator is configured to: receive the difference signal and the input envelope; correct an envelope amplitude based on the difference signal and the input envelope; and based on the corrected envelope amplitude, output the I to the first IQ modulator, the second IQ modulator, and the vector generator.

11. The system of claim 1, wherein the vector generator is an analog Q vector generator.

12. The system of claim 11, wherein the analog Q vector generator uses an equation of Q equals 1 minus the I to generate the Q and the −Q.

13. The system of claim 12, wherein the analog Q vector generator comprises a difference amplifier and an inverter amplifier, wherein the difference amplifier is configured to compare the I to a reference voltage of 1 volt to generate the Q; wherein the inverter amplifier is configured to generate the −Q.

14. The system of claim 1, wherein the vector generator is a digital Q vector generator.

15. The system of claim 14, wherein the digital Q vector generator is configured to: generate the Q and the −Q through use of at least one of: 1) a first equation of $Q=\sqrt{1-I^2}$; 2) a second equation of $Q=1-I$ to generate the Q and the −Q; or 3) a third equation of $$Q = \frac{A}{\tan\left(\frac{\pi A}{z}\right)}.$$

wherein A is amplitude.

16. The system of claim 15, wherein the digital Q vector generator comprises a field-programmable gate array.

17. The system of claim 1,
further comprising an input detector configured to: receive the amplified RF drive; strip the envelope from the amplified RF drive; and output an input envelope of the amplified RF drive;
wherein the vector generator is a digital I and Q vector generator, wherein the digital I and Q vector generator is configured to: receive the input envelope of the amplified RF drive; based at least on the input envelope of the amplified RF drive, generate the I; output the I; and generate the Q and the −Q through use of at least one of: 1) a first equation of $Q=\sqrt{1-I^2}$; 2) a second equation of $Q=1-I$ to generate the Q and the −Q; or 3) a third equation of $$Q = \frac{A}{\tan\left(\frac{\pi A}{z}\right)}.$$

wherein A is amplitude.

18. The system of claim 17, wherein the digital I and Q vector generator comprises a field-programmable gate array.

19. An apparatus, comprising:
an input amplifier configured to: receive a radio frequency (RF) drive from an exciter; amplify the RF drive; and output an amplified RF drive, wherein the RF drive includes phase and envelope information of a modulated signal;
an input limiter configured to: receive the amplified RF drive; cap the amplified RF drive to no more than a predetermined voltage; and output a capped amplified RF drive;
a first in-phase component signal (I) and quadrature component signal (Q) modulator (IQ modulator) configured to: receive the capped amplified RF drive; receive an I and a Q; based at least on the I and the Q, produce a zero degree to ninety degree variable phase shifted output signal that changes relative to an input envelope of an RF drive waveform of the RF drive; and output the zero degree to ninety degree variable phase shifted output signal;
a first amplifier path configured to: receive the zero degree to ninety degree variable phase shifted output signal; and output a first phase modulated signal;
a second IQ modulator configured to: receive the capped amplified RF drive; receive the I and a negative Q (−Q); based at least on the I and the −Q, produce a zero degree to negative ninety degree variable phase shifted output signal that changes relative to the input envelope of the RF drive waveform of the RF drive; and output the zero degree to negative ninety degree variable phase shifted output signal;
a second amplifier path configured to: receive the zero degree to negative ninety degree variable phase shifted output signal; and output a second phase modulated signal, wherein the second phase modulated signal is complementary to the first phase modulated signal; and
a vector generator configured to: generate at least the Q and the −Q; output the Q to the first IQ modulator; and output the −Q to the second IQ modulator.

20. A method, comprising:
receiving, by an input amplifier, a radio frequency (RF) drive from an exciter;
amplifying, by the input amplifier, the RF drive;
outputting, by the input amplifier, an amplified RF drive, wherein the RF drive includes phase and envelope information of a modulated signal;
receiving, by an input limiter, the amplified RF drive;
capping, by the input limiter, the amplified RF drive to no more than a predetermined voltage;
outputting, by the input limiter, a capped amplified RF drive;
receiving, by a first in-phase component signal (I) and quadrature component signal (Q) modulator (IQ modulator), the capped amplified RF drive;
receiving, by the first IQ modulator, an I and a Q;
based at least on the I and the Q, producing, by the first IQ modulator, a zero degree to ninety degree variable phase shifted output signal that changes relative to an input envelope of an RF drive waveform of the RF drive;
outputting, by the first IQ modulator, the zero degree to ninety degree variable phase shifted output signal;
receiving, by a first amplifier path, the zero degree to ninety degree variable phase shifted output signal;
outputting, by the first amplifier path, a first phase modulated signal;
receiving, by a second IQ modulator, the capped amplified RF drive;
receiving, by the second IQ modulator, the I and a negative Q (−Q);
based at least on the I and the −Q, producing, by the second IQ modulator, a zero degree to negative ninety degree variable phase shifted output signal that changes relative to the input envelope of the RF drive waveform of the RF drive;
outputting, by the second IQ modulator, the zero degree to negative ninety degree variable phase shifted output signal;
receiving, by a second amplifier path, the zero degree to negative ninety degree variable phase shifted output signal;

outputting, by the second amplifier path, a second phase modulated signal, wherein the second phase modulated signal is complementary to the first phase modulated signal;

generating, by a vector generator, at least the Q and the −Q;

outputting, by the vector generator, the Q to the first IQ modulator; and outputting, by the vector generator, the −Q to the second IQ modulator.

* * * * *